US012701755B2

(12) United States Patent
Jhan et al.

(10) Patent No.: US 12,701,755 B2
(45) Date of Patent: Aug. 4, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Yi-Ruei Jhan, Keelung City (TW); Kuan-Ting Pan, Taipei City (TW); Yu-Wei Lu, Taipei City (TW); Shi-Ning Ju, Hsinchu City (TW); Kuo-Cheng Chiang, Hsinchu County (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 678 days.

(21) Appl. No.: 17/827,779

(22) Filed: May 29, 2022

(65) Prior Publication Data

US 2023/0402506 A1 Dec. 14, 2023

(51) Int. Cl.
*H10D 30/67* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01); *H10D 30/6713* (2025.01); *H10D 30/6735* (2025.01); *H10D 30/6757* (2025.01); *H10D 62/115* (2025.01); *H10D 84/0128* (2025.01); *H10D 84/013* (2025.01); *H10D 84/0147* (2025.01);
(Continued)

(58) Field of Classification Search
CPC .... H10D 62/121; H10D 30/014; H10D 30/43; H10D 30/6713; H10D 30/6735; H10D 30/6757; H10D 62/115; H10D 84/0128; H10D 84/013; H10D 84/0147; H10D 84/0151; H10D 84/038; H10D 84/0188; H10D 84/903; H10D 64/252; H10D 84/201; H10D 18/60; H02K 15/027; B65D 83/141; H10H 20/0165; H10H 20/826; A23B 2/783; A61K 40/4218; H10F 77/955; B82Y 10/00
See application file for complete search history.

(56) References Cited

U.S. PATENT DOCUMENTS 8,772,109 B2 7/2014 Colinge
8,785,285 B2 7/2014 Tsai et al.
(Continued)

*Primary Examiner* — Marlon T Fletcher
*Assistant Examiner* — Samuel Jonathan Smith
(74) *Attorney, Agent, or Firm* — JCIPRNET

(57) ABSTRACT

Provided are a semiconductor device and a method of forming the same. The semiconductor device includes a semiconductor device. The semiconductor device includes a substrate including a plurality of fins, a plurality of semiconductor nanosheets stacked on the plurality of fins, a plurality of gate stacks wrapping the plurality of semiconductor nanosheets, an isolation structure around the plurality of fins, and a separator structure on the isolation structure to separate the plurality of gate stacks from each other. The separator structure includes a body and a cap on the body. The cap includes a first portion and a second portion. Sidewalls and bottom of the second portion is wrapped by the first portion.

20 Claims, 17 Drawing Sheets

(51) Int. Cl.
    *H10D 30/43*         (2025.01)
    *H10D 62/10*         (2025.01)
    *H10D 84/01*         (2026.01)
    *H10D 84/03*         (2025.01)

(52) U.S. Cl.
    CPC ....... *H10D 84/0151* (2025.01); *H10D 84/038*
                           (2025.01)

(56)            References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,209,247 | B2 | 12/2015 | Colinge et al. |
| 9,236,267 | B2 | 1/2016 | De et al. |
| 9,236,300 | B2 | 1/2016 | Liaw |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2021/0057525 | A1* | 2/2021 | Chiang .................. H10D 64/01 |
| 2021/0343600 | A1* | 11/2021 | Chen ................... H10D 30/014 |
| 2021/0408254 | A1* | 12/2021 | Kim ................... H10D 84/0158 |
| 2022/0320312 | A1* | 10/2022 | Park ................... H10D 62/121 |
| 2022/0328482 | A1* | 10/2022 | Lan ...................... H01L 29/775 |

\* cited by examiner

SEMICONDUCTOR DEVICE AND METHOD OF FORMING THE SAME

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, multi-gate devices have been introduced to replace planar transistors. However, there are quite a few challenges to be handled for the multi-gate technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
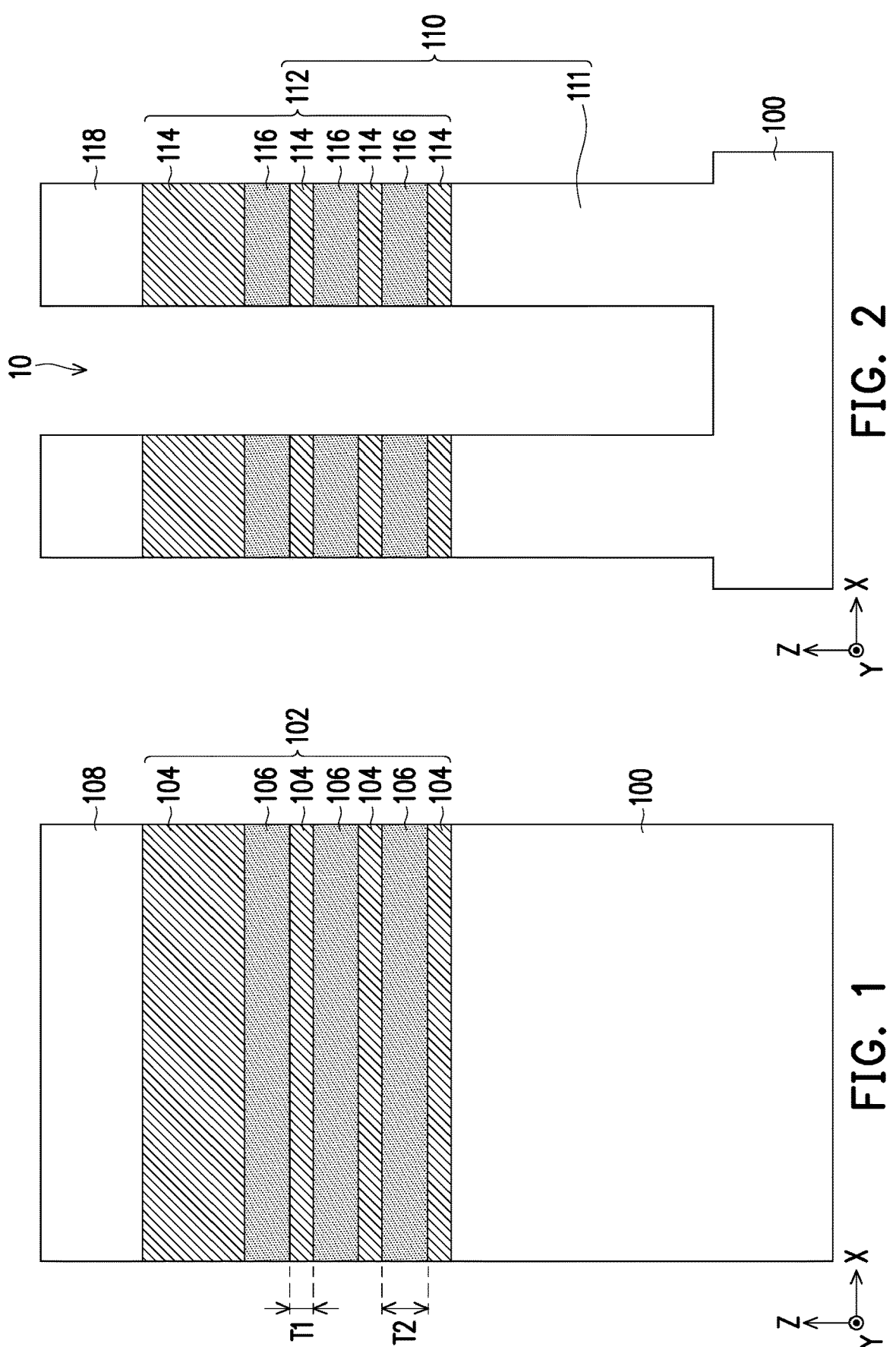
FIG. 1 to FIG. 20 are various views of intermediate stages in the formation of a semiconductor device in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure.

In accordance with some embodiments, a separator structure (or referred to as cut metal gate, CMG) structure is formed to separate/cut gate stacks from each other. The separator structure is free of voids or seams therein which is benefit to avoid filling of conductive material therein, thereby preventing abnormal bridging between the gate electrodes form suffering yield issue.

FIG. 1 to FIG. 20 are various views of intermediate stages in the formation of a semiconductor device in accordance with an embodiment of the disclosure. The semiconductor device illustrated in the following embodiments may be applied to, but not limited thereto, a fin field-effect transistor (FinFET), gate-all-around (GAA) FET, or other transistors including a multi-gate.

Referring to FIG. 1, a substrate 100 is provided. In some embodiments, the substrate 100 includes a crystalline silicon substrate (e.g., wafer). The substrate 100 may include various doped regions (e.g., p-type well and/or n-type well) depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. In some embodiments, an anti-punch-through (APT) implantation is performed on a top portion of the substrate 100 to form an APT region. The conductivity type of the dopants implanted in the APT region is the same as that of the doped regions (or wells). The APT region may extend under the subsequently formed source/drain (S/D) features 140 (FIG. 15), and are used to reduce the leakage from the S/D features 140 to substrate 100. For clarity, the doped regions and the APT region are not illustrated in FIG. 1 and subsequent drawings. In some alternative embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

As shown in FIG. 1, a semiconductor stack 102 is formed on the substrate 100. The semiconductor stack 102 may include a plurality of first layers 104 and a plurality of second layers 106 stacked alternately in a Z direction. Although only three first layers 104 and three second layers 106 are illustrated in FIG. 1, the embodiments of the present disclosure are not limited thereto. In other embodiments, the number of the first layers 104 and the second layers 106 are adjusted by the need, such as one first layer, two first layers, four first layers, or more first layers. The number of the second layers corresponds to the number of the first layers.

In some embodiments, the first layers 104 and the second layers 106 include different materials. For example, the first layers 104 are SiGe layers having a germanium percentage in the range between about 15 wt % and 40 wt %, and the second layers 106 are Si layers free from germanium. However, the embodiment of the disclosure is not limited thereto, in other embodiments, the first layers 104 and the second layers 106 have materials with different etching selectivities. In some embodiments, the first layers 104 and the second layers 106 are formed by an epitaxial growth process, such as a molecular beam epitaxy (MBE) process, a metalorganic chemical vapor deposition (MOCVD) process, or the like. In the case, the first layers 104 are epitaxial SiGe layers, and the second layers 106 are epitaxial Si layers. In some alternative embodiments, the first layers 104 and the second layers 106 are formed by a suitable deposition, such as chemical vapor deposition (CVD), atomic layer deposition (ALD), or the like. In the case, the first layers 104 are poly-SiGe layers, and the second layers 106 are poly-Si layers.

In some embodiments, the first layers 104 have the same thickness T1 and the second layers 106 have the same thickness T2. In some embodiments, the thickness T1 may be 5 nm to 20 nm and the second thickness T2 may be 5 nm to 20 nm. Alternatively, the first layers 104 may have different thicknesses, and the second layers 106 may have different thicknesses. In some other embodiments, the first layers 104 and the second layers 106 have the same or different thicknesses.

As shown in FIG. 1, a mask layer 108 is formed on the semiconductor stack 102. The mask layer 108 may include a single-layered structure, a two-layered structure, or a multi-layered structure. For example, the mask layer 108 includes a silicon oxide (SiO) layer and a silicon nitride (SiN) layer on the SiO layer. In some embodiments, the mask layer 108 is formed by CVD, ALD, or the like.

Referring to FIG. 1 and FIG. 2, the mask layer 108 is patterned to form a plurality of mask strips 118. The semiconductor stack 102 and the substrate 100 are then patterned by using the mask strips 118 as a mask, so as to form a plurality of trenches 10. In the case, a plurality of fins 111 and a plurality of stacks of semiconductor strips 112 on the fins 111 are formed between the trenches 10. As shown in FIG. 2, the trenches 10 extend into the substrate 100, and have lengthwise directions parallel to each other. Herein, the stacks of semiconductor strips 112 are referred to as nanosheet stacks 112, and the combination of the fins 111 and the nanosheet stacks 112 thereon are referred to as hybrid fins 110, alternatively. Although only two hybrid fins 110 are illustrated in FIG. 2, the embodiments of the present disclosure are not limited thereto. In other embodiments, the number of the hybrid fins 110 may be adjusted by the need, such as one hybrid fin, three hybrid fins, four hybrid fins, or more hybrid fins. In addition, the mask strips 118 illustrated in FIG. 2 have flat top surfaces. However, the embodiments of the present disclosure are not limited thereto. In other embodiments, the mask strips 118 may have dome top surfaces due to the high aspect ratio etching.

As shown in FIG. 2, in some embodiments, the nanosheet stack 112 include a plurality of first nanosheets 114 (collectively referred to as "first nanosheets 114") and a plurality of second nanosheets 116 (collectively referred to as "second nanosheets 116") stacked alternately along a Z direction and extending along a Y direction.

Figures 3, 4:
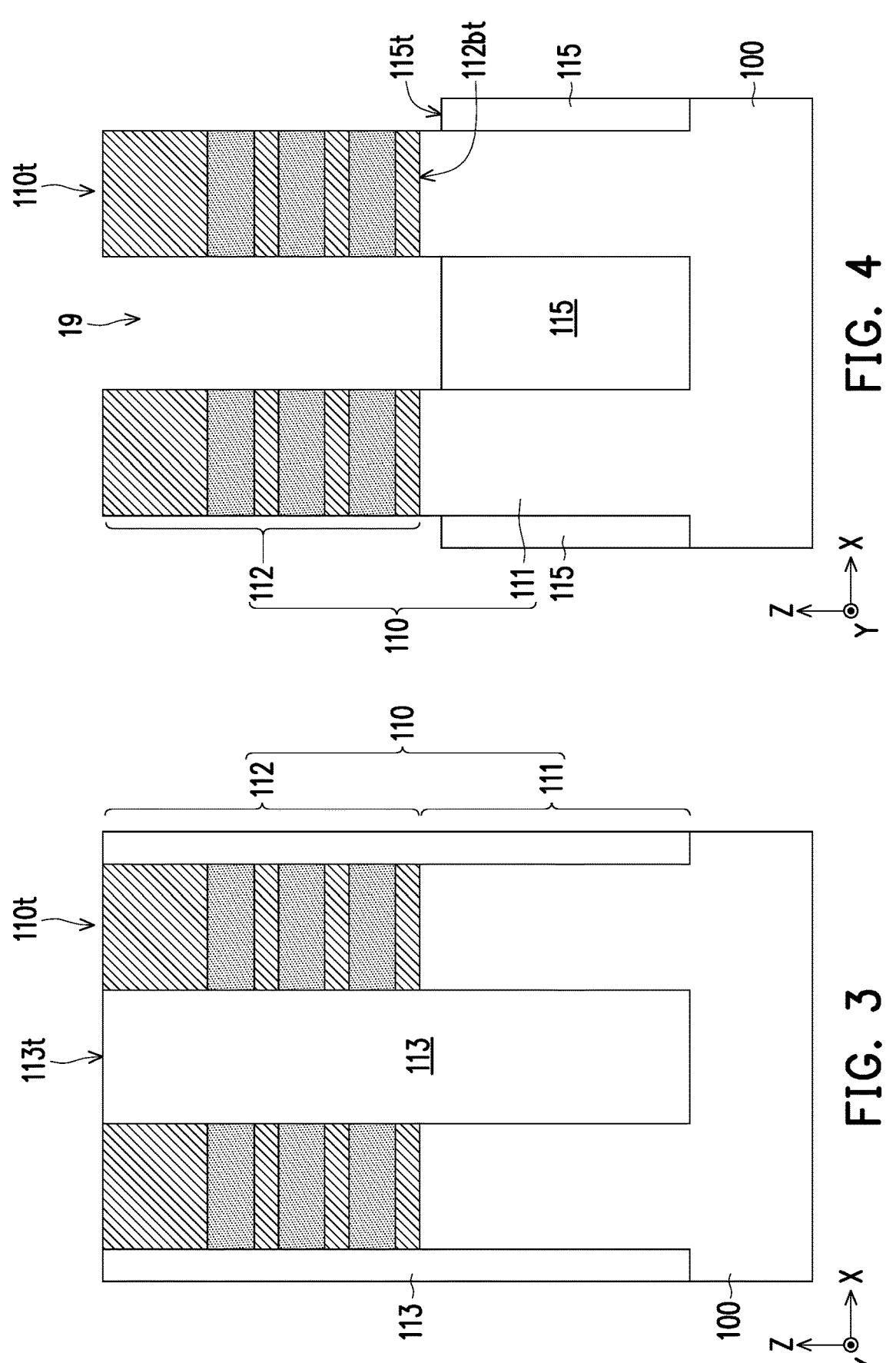

Referring to FIG. 2 and FIG. 3, a plurality of insulating layers 113 are formed in trenches 10. In detail, in some embodiments, an insulating material is formed on the substrate 100 to cover the hybrid fins 110 and to fill up the trenches 10. In addition to the hybrid fins 110, the insulating material further covers the mask strips 118. The insulating material may include silicon oxide, silicon nitride, silicon oxynitride, a spin-on dielectric material, or a low-k dielectric material. Herein, the low-k dielectric materials are generally dielectric materials having a dielectric constant lower than 3.9. The insulating material may be formed by flowable chemical vapor deposition (FCVD), high-density-plasma chemical vapor deposition (HDP-CVD), sub-atmospheric CVD (SACVD), or spin on. A planarization process may be performed, to remove a portion of the insulating material and the mask strips 118 until the hybrid fins 110 are exposed. In the case, as shown in FIG. 3, top surfaces 110t of the hybrid fins 110 are substantially coplanar with a top surface 113t of the planarized insulating material or insulating layers 113. In some embodiments, the planarization process includes a chemical mechanical polish (CMP), an etching back process, a combination thereof, or the like.

Referring to FIG. 3 and FIG. 4, the insulating layers 113 are recessed to form a plurality of isolation structures 115 and a plurality of trenches 19. After recessing the insulating layers 113, the hybrid fins 110 protrude from top surfaces 115t of the isolation structures 115. That is, the top surfaces 115t of the isolation structures 115 may be lower than the top surfaces 110t of the hybrid fins 110. In some embodiments, the nanosheet stacks 112 are exposed by the isolation structures 115. The top surfaces 115t of the isolation structures 115 may be substantially coplanar with or lower than bottom surfaces 112bt of the nanosheet stacks 112. Further, the top surfaces 115t of the isolation structures 115 may have a flat surface as illustrated, a convex surface, a concave surface (such as dishing), or a combination thereof. The trenches 19 have lengthwise directions parallel to each other. The trenches 19 expose the top surfaces 115t of the isolation structures 115, and sidewalls of the nanosheet stacks 112.

In some embodiments, the insulating layers 113 are recessed by using an appropriate etching process, such as a wet etching process with hydrofluoric acid (HF), a dry etching process, or a combination thereof. In some embodiments, a height difference between the top surfaces 110t of the hybrid fins 110 and the top surfaces 115t of the isolation structures 115 ranges from about 30 nm to about 100 nm. In some embodiments, the isolation structures 115 may be shallow trench isolation (STI) structures, deep trench isolation (DTI) structures, or the like.

Figure 5:
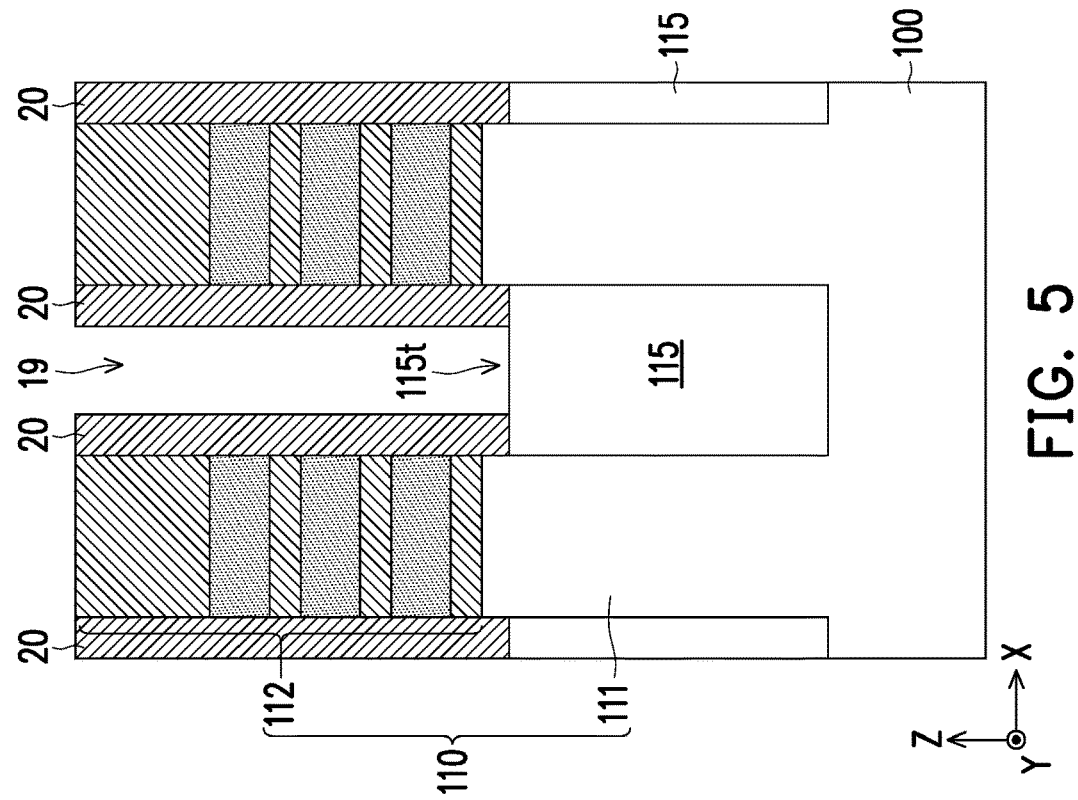

Referring to FIG. 4 and FIG. 5, spacers 20 are formed on the sidewalls of the nanosheet stacks 112. In some embodiments, a material of the spacers 20 is the same as the material of the first nanosheets 114 of the nanosheet stacks 112, but the embodiments of the present disclosure are not limited thereto. The spacers 20 may be formed by selectively grown process. In some embodiments, the spacers 20 may be a silicon-germanium (SiGe), and may be formed by an epitaxial-grown process. During the epitaxial-grown process, the spacer materials are epitaxially grown from sidewalls of the first nanosheets 114, and further extend up and down to form the spacers 20. In some embodiments, the spacers 20 are conformal layers. After the spacers 20 are formed, there is still a part of the space in the trench 19 left, and a portion of the top surface 115t of the isolation structure 115 is exposed.

Figure 6:
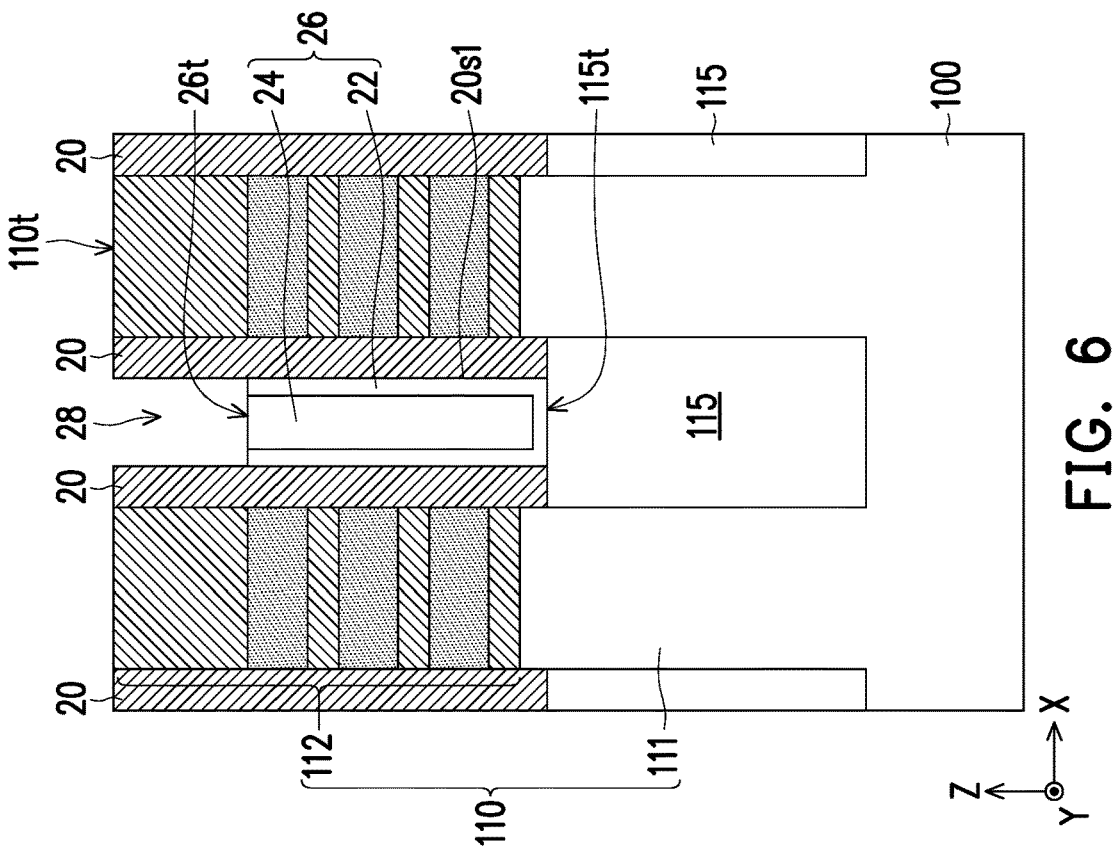

Referring to FIG. 5 and FIG. 6, a body 26 of a separator structure 60 (shown in FIG. 10) is formed in the space of the trench 19 (shown in FIG. 5). A top surface 26t of the body 26 is lower than the top surfaces 110t of the hybrid fins 110, and a trench 28 is formed on the body 26. In the case, the body 26 includes a first part 22 and a second part 24. In some embodiments, the first part 22 is a conformal layer and formed on sidewalls 20s1 of the spacers 20 and the top surface 115t of the isolation structure 115. In some embodiments, the first part 22 and the second part 24 of the body 26 may be formed as follows.

Referring to FIG. 5 and FIG. 6, a first part material is initially formed over the spacers 20 and the nanosheet stacks 112 and fill in the trench 19. Subsequently, a second part material are formed over the first part material and fill up the remaining space of the trench 19. The first part material and the second part material are formed of dielectric materials, such as silicon oxide, silicon nitride, carbonized silicon nitride (SiCN), SiCON, or a combination thereof, and may be formed by ALD, FCVD, CVD, HDPCVD, SACVD, spin-on, sputtering, or any other suitable method. The first part material and the second part material may include different materials. In some embodiments, the first part material includes SiCON, and the second part material includes silicon oxide. Thereafter, the second material and the first part material are partially removed by an etching back process, so that the first part 22 and the second part 24 are formed, and the trench 28 is formed on the body 26. In the case, as shown in FIG. 6, a top surface of the first part 22 is substantially coplanar with a top surface of the second part 24. In other case, a top surface of the first part 22 and a top surface of the second part 24 may have a step. The body 26 may be free of voids or seams therein. That is, the second part 24 may be free of voids or seams therein.

Figure 10:
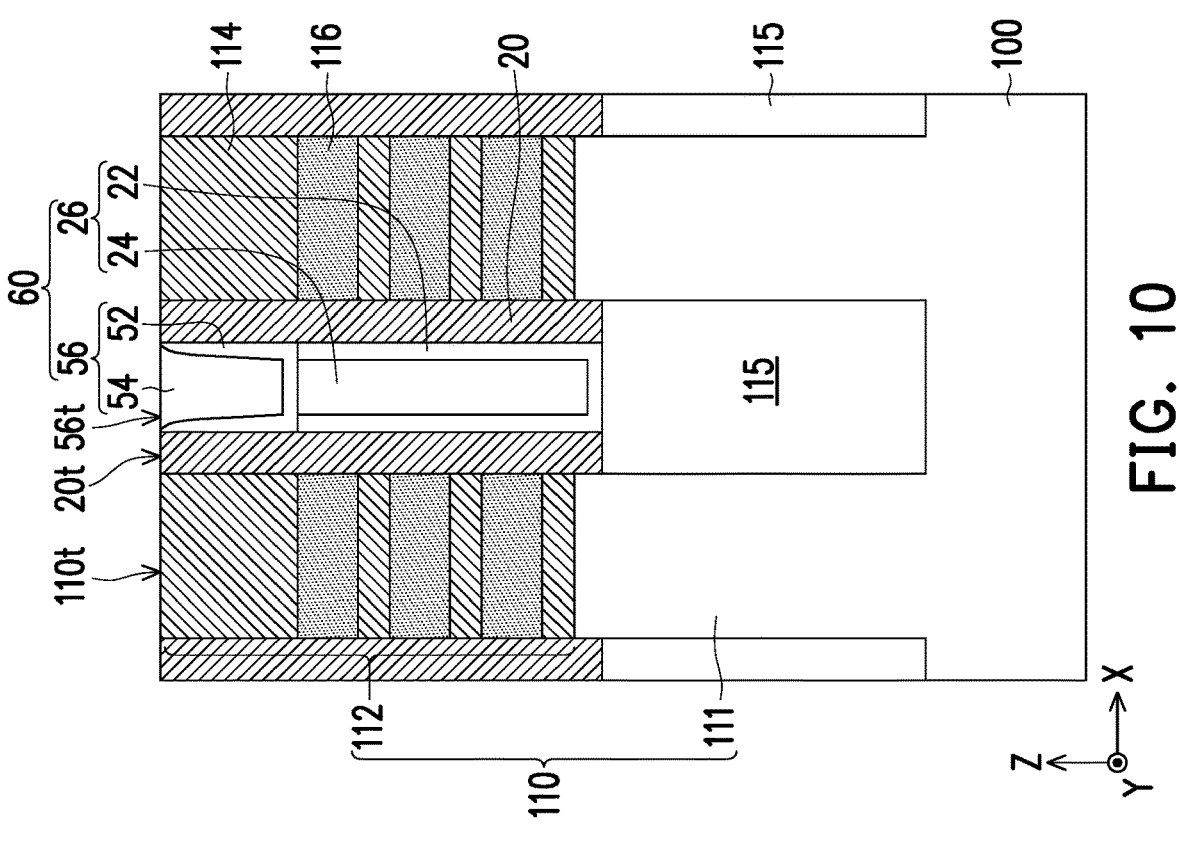

Referring to FIG. 10, a cap 56 of the separator structure 60 (shown in FIG. 10) is formed in the trench 28 (shown in FIG. 6). The cap 56 is disposed on and in contact with the body 26. A top surface 56t of the cap 56 may be coplanar with the top surfaces 110t of the hybrid fins 110. In the case, the cap 56 includes a first portion 52 and a second portion 54. In some embodiments, the first portion 52 and the second portion 54 of the cap 56 may be formed as follows and refer to FIG. 7 to FIG. 10.

Figure 7:
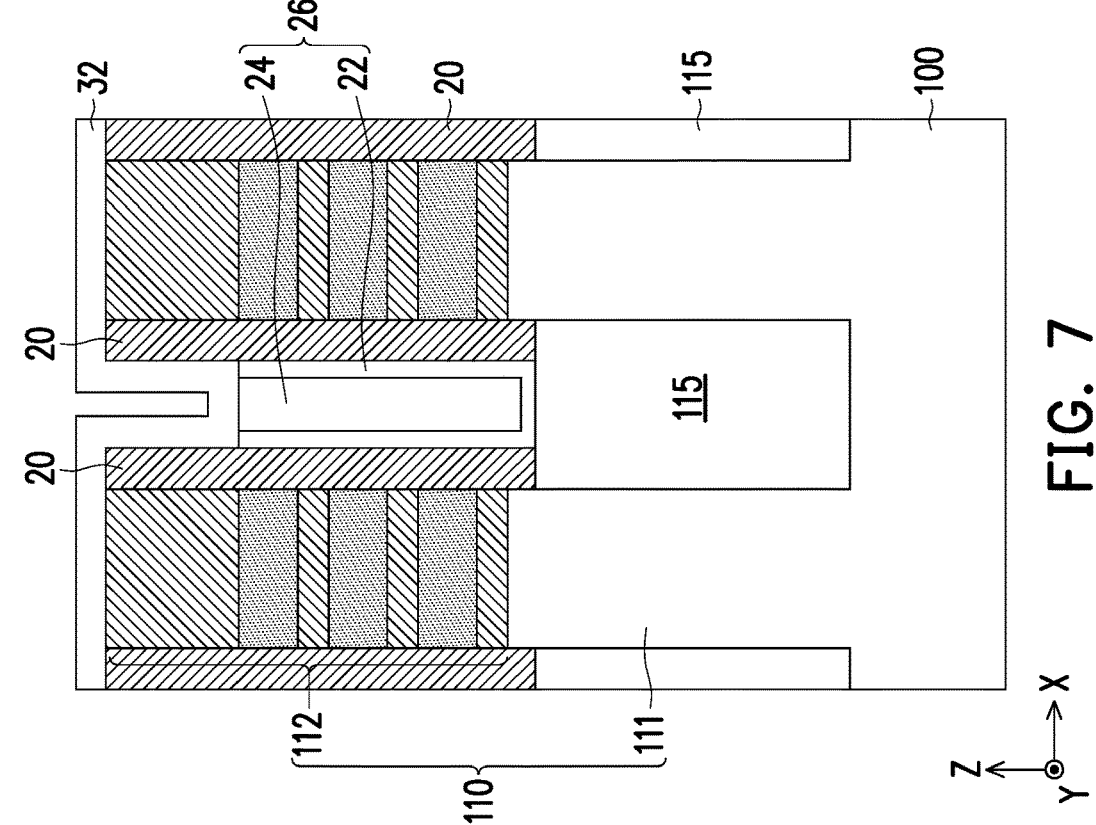

Referring to FIG. 6 and FIG. 7, a first material 32 is initially formed over the spacers 20 and the nanosheet stacks 112 and fill in the trench 28. The first material 32 is formed of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The first material 32 may be formed by CVD, ALD or any suitable method. In one embodiment, the first material 32 is formed by using a highly conformal deposition process, such as ALD in order to ensure the formation of a first material 32 having a uniform thickness.

Figure 8:
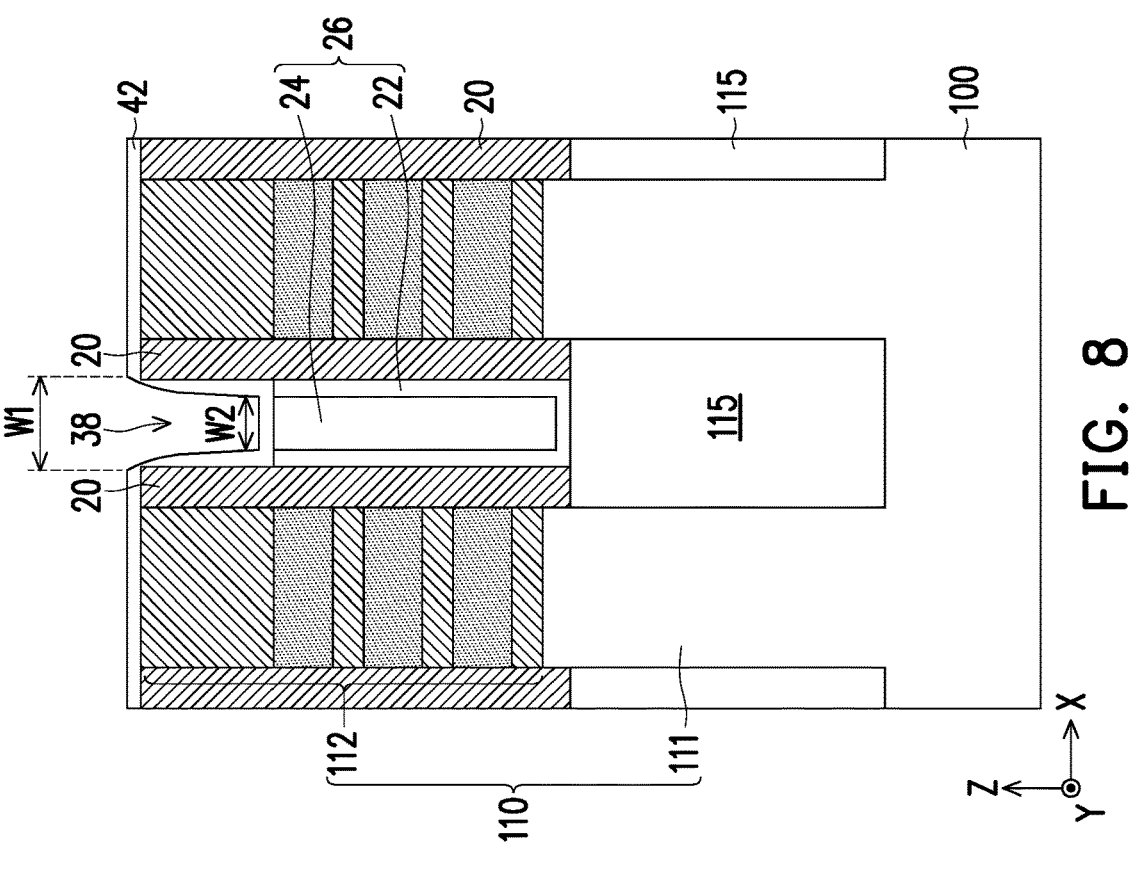

Referring to FIG. 8, the first material 32 is partially removed by an etching back process to thin the first material 32 so that a first portion material 42 is formed. At the same time, a trench 38 is formed on the first portion material 42. In detail, the first material 32 covering top corners of the spacers 20 is chamfered such that the first portion material 42 is formed with a minimum thickness at the top corners of the spacers 20. In other words, the trench 38 has a top width W1 that is greater than a bottom width W2 of the trench 38. In some embodiment, the trench 38 has an inverted trapezoid profile.

Referring to FIG. 8, a second material 44 is formed over the first portion material 42 and fills the trench 38. Since the trench 38 has the top width W1 that is greater than the bottom width W2, it is favorable for the second material 44 to fill the trench 38. As a result, the second material 44 has a good top step coverage and a good bottom step coverage to fill the trench 38. The second material 44 is formed of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The second material 44 may be the same or different from the first material 32. The second material 44 may be formed by ALD, FCVD, CVD, HDPCVD, SACVD, spin-on, sputtering, or any other suitable method. In some embodiments, the second material 44 and the first material 32 are both high-k dielectric material, and formed by different method. For example, the first material 32 and the second material 44 are a same high-k dielectric material, while the first material 32 is formed by ALD method, and the second material 44 is formed by spin-on method, the embodiments of the present disclosure are not limited thereto.

Figure 9:
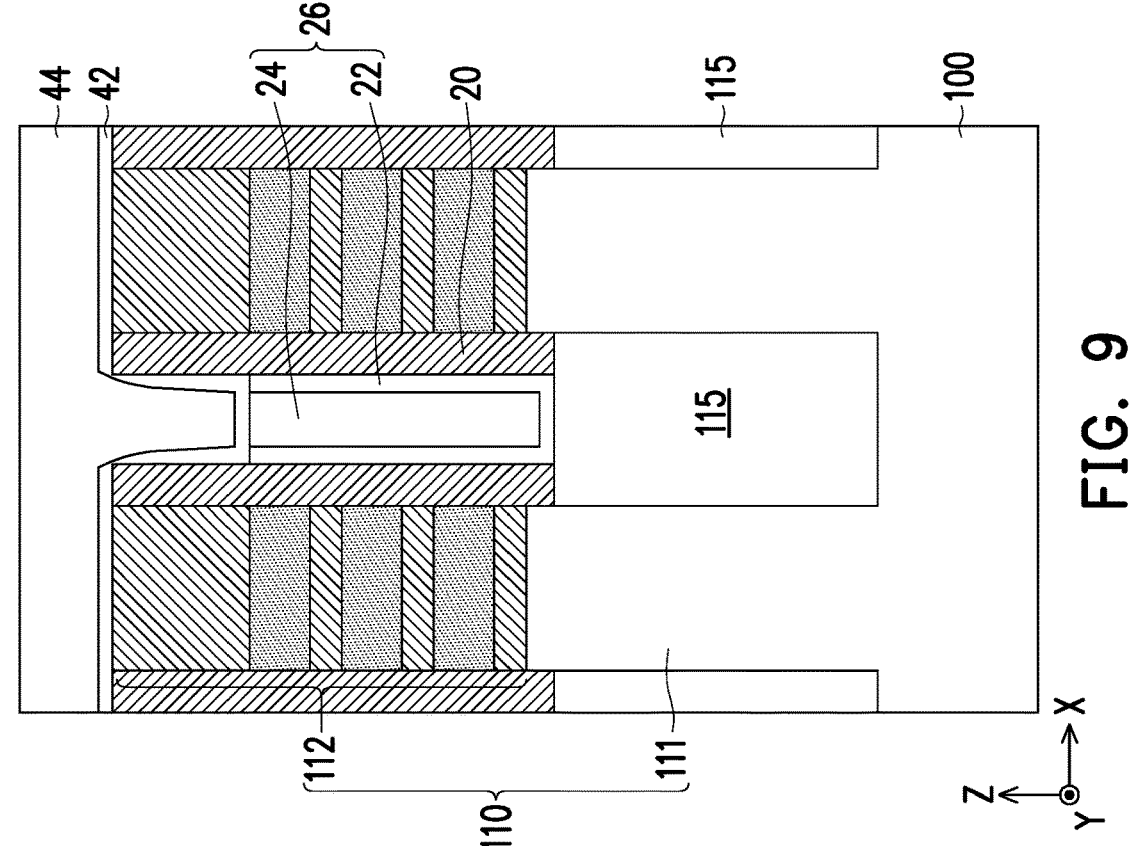

Referring to FIG. 9 and FIG. 10, a planarization process may be performed to remove a portion of the second material 44 and a portion of the first portion material 42 until the hybrid fins 110 and the spacers 20 are exposed. As a result, the first portion 52 and the second portion 54 are formed. The first portion and the second portion 54 are collectively referred to as the cap 56. In the case, a top surface 56t of the cap 56 is substantially coplanar with the top surfaces 110t of the hybrid fins 110 and top surfaces 20t of the spacers 20.

Referring to FIG. 10, as a result, the separator structure 60 is formed on the isolation structure 115. The separator structure 60 includes the body 26 and the cap 56. The body 26 is longitudinally sandwiched between the isolation structure 115 and the cap 56, and laterally sandwiched between the spacers 20. The cap 56 is longitudinally disposed on and in contact with the body 26, and laterally sandwiched between the spacers 20. Since the top width W1 of the trench 38 is greater than the bottom width W2 of the trench 38, and the second material 44 has the good step coverage to fill the trench 38, the cap 56, particularly the second portion 54, may be formed without voids or seams therein.

Figure 11:
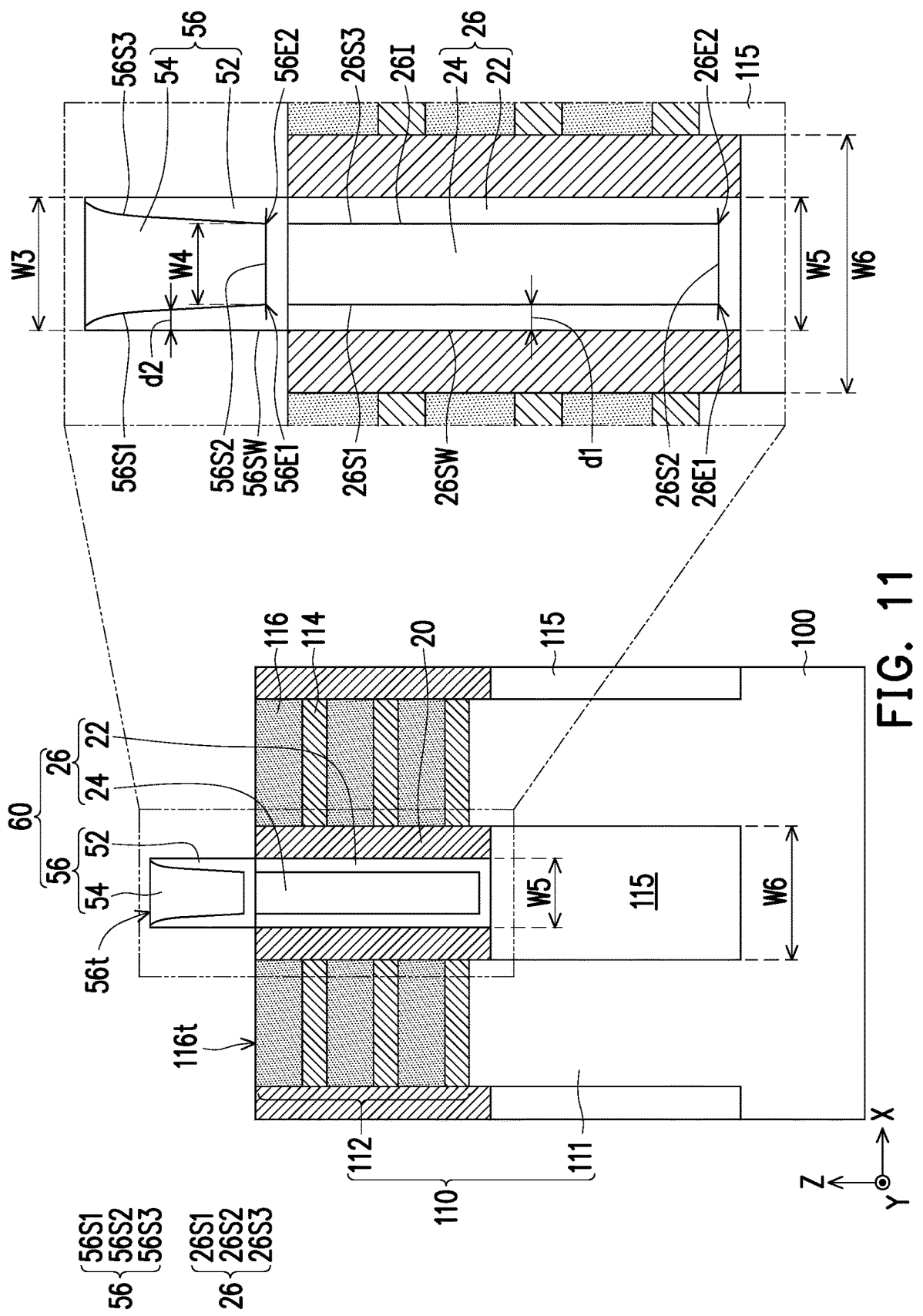

Referring to FIG. 11, a topmast first nanosheets 114 of the dummy gate stack 122 and a portion of the spacers 20 are removed by an anisotropic etching process, an isotropic etching process, or a combination thereof. As a result, the cap 56 of the separator structure 60 protrudes from a top surface 116t of a topmost second nanosheets 116 of the nanosheet stacks 112, while the body 26 of the separator structure 60 is embedded in the nanosheet stacks 112 in some embodiments.

The body 26 of the separator structure 60 is disposed on and in contact with the isolation structure 115. A bottom width W5 of the body 26 is smaller than a top width W6 of the isolation structure 115. The first part 22 of the body 26 is longitudinally sandwiched between the second part 24 of the body 26 and the isolation structure 115, and the cap 56 and the isolation structure 115. The first part 22 has a U-shape cross-section in some embodiments. The second part 24 is surrounded by the first part 22. In other words, sidewalls and bottom of the second part 24 is wrapped by the first part 22. The second part 24 is longitudinally sandwiched between the cap 56 and the isolation structure 115, and laterally sandwiched between the first part 22.

The body 26 has an interface 26I between the first part 22 and the second part 24. The interface 26I may be has a U-shape cross-section, for example. In detail, the interface 26I may include a first segment 26S1, a second segment 26S2, and a third segment 26S3. The second segment 26S2 extends horizontally and is connected to a bottom end 26E1 of the first segment 26S1 and a bottom end 26E2 of the third segment 26S3. In some embodiments, the second segment 26S2 is a horizontal line. The first segment 26S1 and the third segment 26S3 extend longitudinally to connected to the second segment 26S2. In some embodiments, the first segment 26S1 and the third segment 26S3 are vertical lines. The horizontal distances d1 between the first segment 26S1 and one of the outer sidewalls 26SW are substantially the same from top to bottom.

The cap 56 of the separator structure 60 is disposed on and in contact with the body 26 of the separator structure 60. Outer sidewalls 56SW of the cap 56 may be substantially aligned with outer sidewalls 26SW of the body 26. In some embodiments, the outer sidewalls 56SW of the cap 56 are substantially flush with the outer sidewalls 26SW of the body 26. An outer profile of the first portion 52 has a U-shape cross-section in some embodiments. The second portion 54 is surrounded by the first portion 52. In other words, sidewalls and bottom of the second portion 54 is wrapped by the first portion 52. In some embodiment, the second portion 54 has an inverted trapezoid profile. In other words, the second portion 54 is tapered toward the body 26, such that a bottom width W4 of the second portion 54 is smaller than a top width W3 of the second portion 54. Further, the cap 56 has an interface 56I between the first portion 52 and the second portion 54.

A shape of the interface 56I in the cap 56 is different from the shape of the interface 26I in the body 26. In the case, the interface 26I may has a U-shape cross-section, while the interface 56I may has a deformed U-shape cross-section, for example. In detail, the interface 56I may include a first segment 56S1, a second segment 56S2, and a third segment 56S3. The second segment 56S2 extends horizontally and is connected to a bottom end 56E1 of the first segment 56S1 and a bottom end 56E3 of the third segment 56S3. In some embodiments, the second segment 56S2 is a horizontal line. The first segment 56S1 and the third segment 56S3 extend longitudinally to connected to the second segment 56S2. In some embodiments, the first segment 56S1 and the third segment 56S3 are arcs or inclined lines. The horizontal distance d2 between the first segment 56S1 and one of the outer sidewalls 56SW is reduced form bottom to top.

Figure 12:
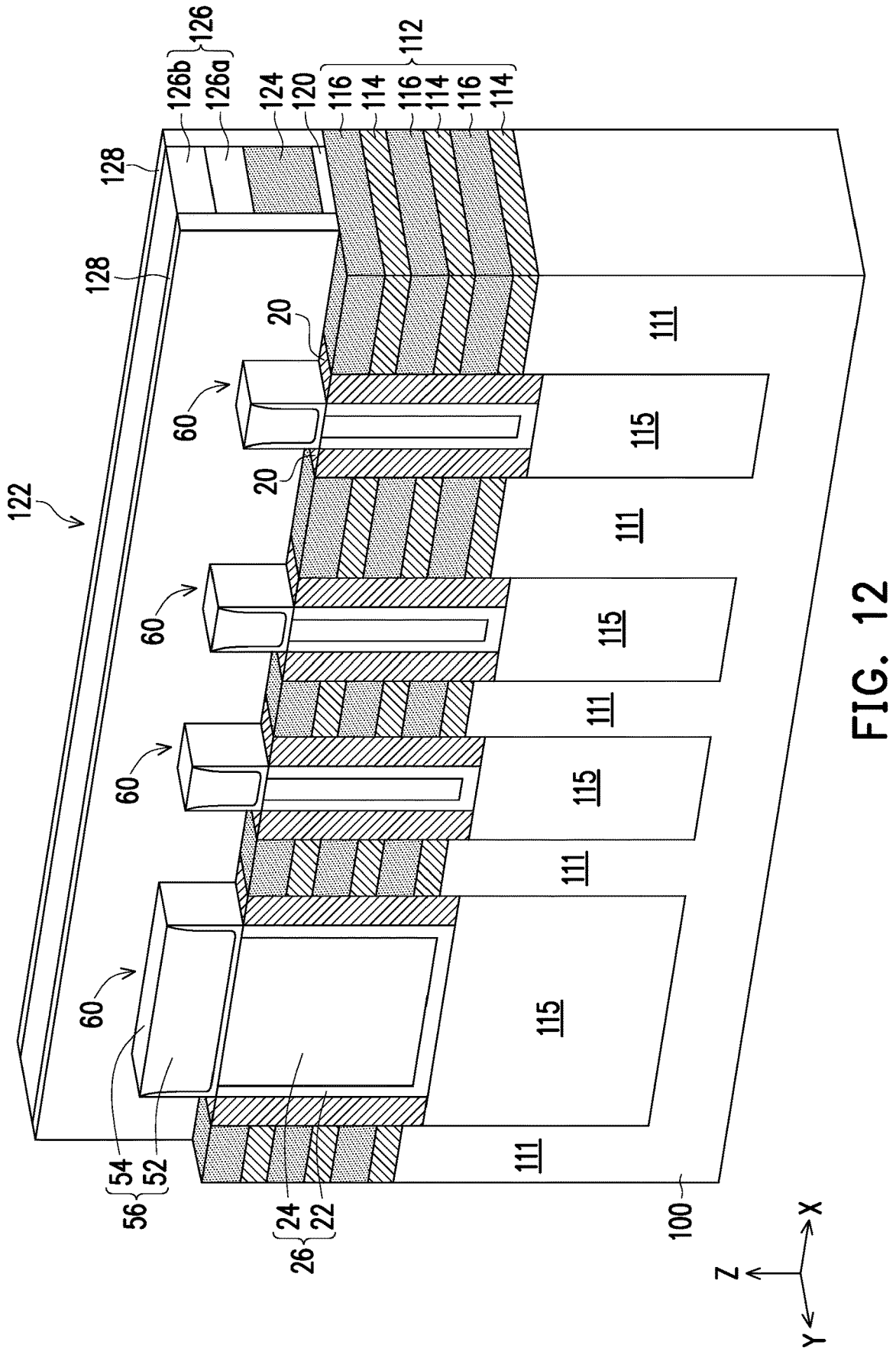

Referring to FIG. 12, a dummy gate stack 122 is formed over portions of the nanosheet stacks 112 and portion of the separator structures 60. The dummy gate stack 122 may extend along a X direction perpendicular to the extending direction of the nanosheet stacks 112. That is, the dummy gate stack 122 may be formed across the nanosheet stacks 112.

Specifically, the dummy gate stack 122 may include a dummy gate dielectric layer 120 and a dummy gate electrode 124 over the dummy dielectric layer 120. The dummy dielectric layer 120 includes silicon oxide, silicon nitride, silicon oxynitride, or the like, and may be formed by CVD, ALD or the like. In some alternative embodiments, the dummy dielectric layer 120 and the isolation structures 115 have the same or different dielectric materials. In some embodiments, the dummy gate electrode 124 includes a silicon-containing material, such as poly-silicon, amorphous silicon, or a combination thereof. The dummy gate electrode 124 may be formed by using a suitable process, such as ALD, CVD, PVD, plating, or combinations thereof. Although the dummy gate electrode 124 illustrated in FIG. 11 is a single-layered structure, the embodiments of the present disclosure are not limited thereto. In other embodiments, the dummy gate electrode 124 may be a multi-layered structure. The dummy gate stack 122 may also include hard mask layer 126 over dummy gate electrode 124. In some embodiments, the hard mask layer 126 includes a single-layered structure, a two-layered structure, a multi-layered structure. For example, the hard mask layer 126 includes a silicon oxide layer 126a and a silicon nitride layer 126b over the silicon oxide layer 126a.

As shown in FIG. 12, a pair of spacers 128 are also formed on sidewalls of the dummy gate stack 122. In some embodiments, the spacers 128 and the dummy gate stack 122 have the same extending direction, namely, the X direction. Similar to the dummy gate stack 122, the spacers 128 are also formed across the nanosheet stacks 112 and another portion of the separator structures 60. In some embodiments, the spacers 128 are formed of dielectric materials, such as silicon oxide, silicon nitride, carbonized silicon nitride (SiCN), SiCON, or a combination thereof. Although the spacers 128 illustrated in FIG. 11 is a single-layered structure, the embodiments of the present disclosure are not limited thereto. In other embodiments, the spacers 128 may be a multi-layered structure. For example, the spacer 128 may include a silicon oxide layer and a silicon nitride layer on the silicon oxide layer. As shown in FIG. 12, the dummy gate stack 122 and the spacers 128 cover middle portions of the nanosheet stacks 112, and reveal the opposite end portions not covered.

Figure 13:
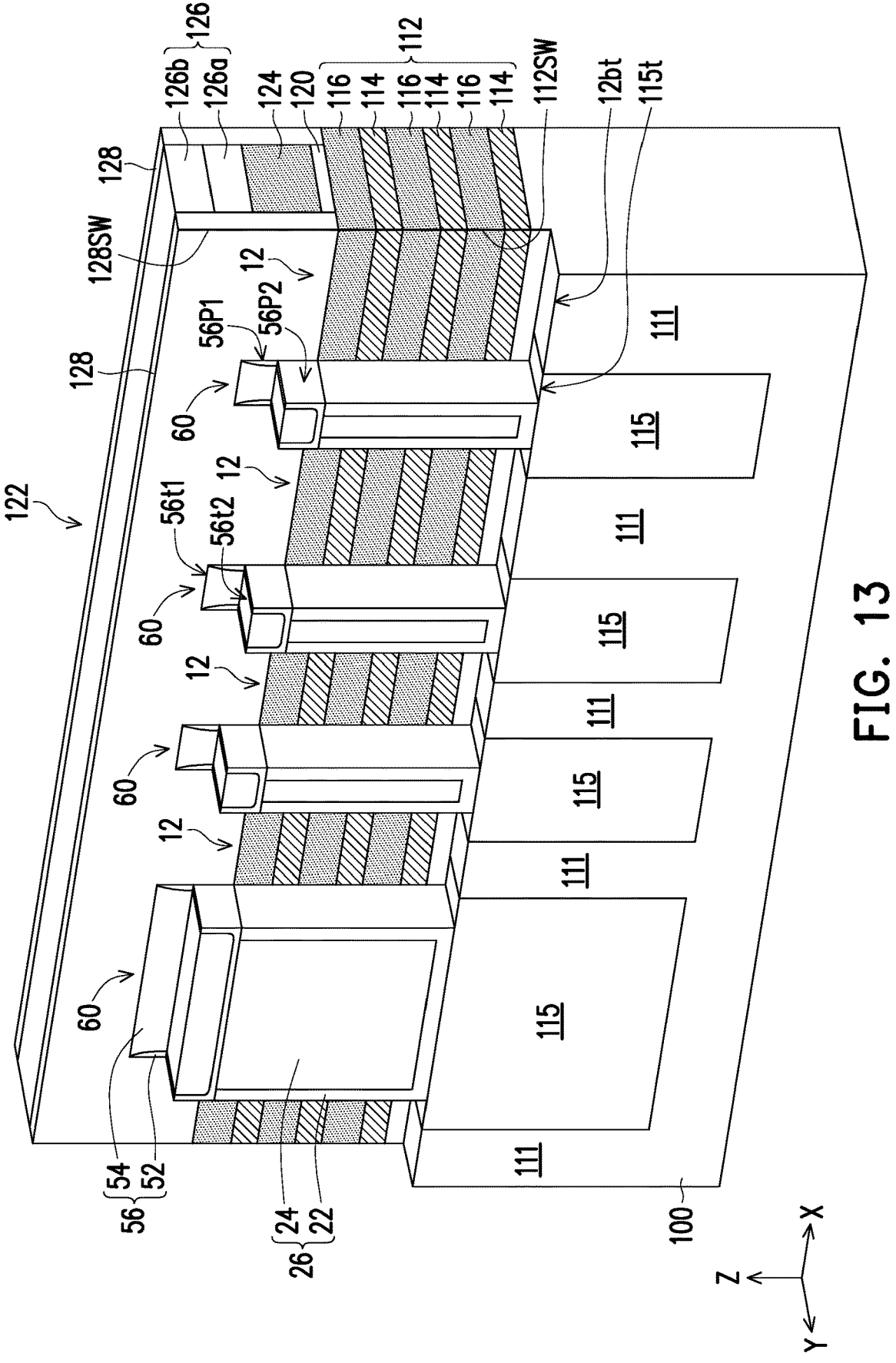

Referring to FIG. 13, the end portions of the nanosheet stacks 112 and the spacers 20 are removed and recessed to form recesses 12. Herein, the recesses may be referred to as source/drain (S/D) recesses 12. In some embodiments, the end portions of the nanosheet stacks 112 may be removed by an anisotropic etching process, an isotropic etching process, or a combination thereof. In some embodiments, the S/D recesses 12 further extend into the fins 111 and lower than the top surfaces 115t of the isolation structures 115. In other words, the end portions of the nanosheet stacks 112 are entirely removed and portions of the fins 111 are further removed. In the case, as shown in FIG. 11, the bottom surfaces 12*bt* of the S/D recesses 12 are lower than the top surfaces 115*t* of the isolation structures 115.

In some embodiments, during removal the end portions of the nanosheet stacks 112, portions 56P1 of the caps 56 of the separator structures 60, which are covered by the dummy gate stack 122 and the spacers 128 may be left. Other portion of the caps 56 of the separator structures 60, which are not covered by the dummy gate stack 122 and the spacers 128, are partially removed. As a result, portions P2 of the caps 56 may be left. In other words, top surface 56*t*2 of the portions P2 of the caps 56, which are not covered by the dummy gate stack 122 and the spacers 128 is lower than top surfaces 56*t*1 of the portions 56P1 of the caps 56, which are covered by the dummy gate stack 122 and the spacers 128. After forming the S/D recesses 12, a sidewall 112SW of the nanosheet stacks 112 may be aligned with an outer sidewall 128SW of the spacers 128.

Figure 14:
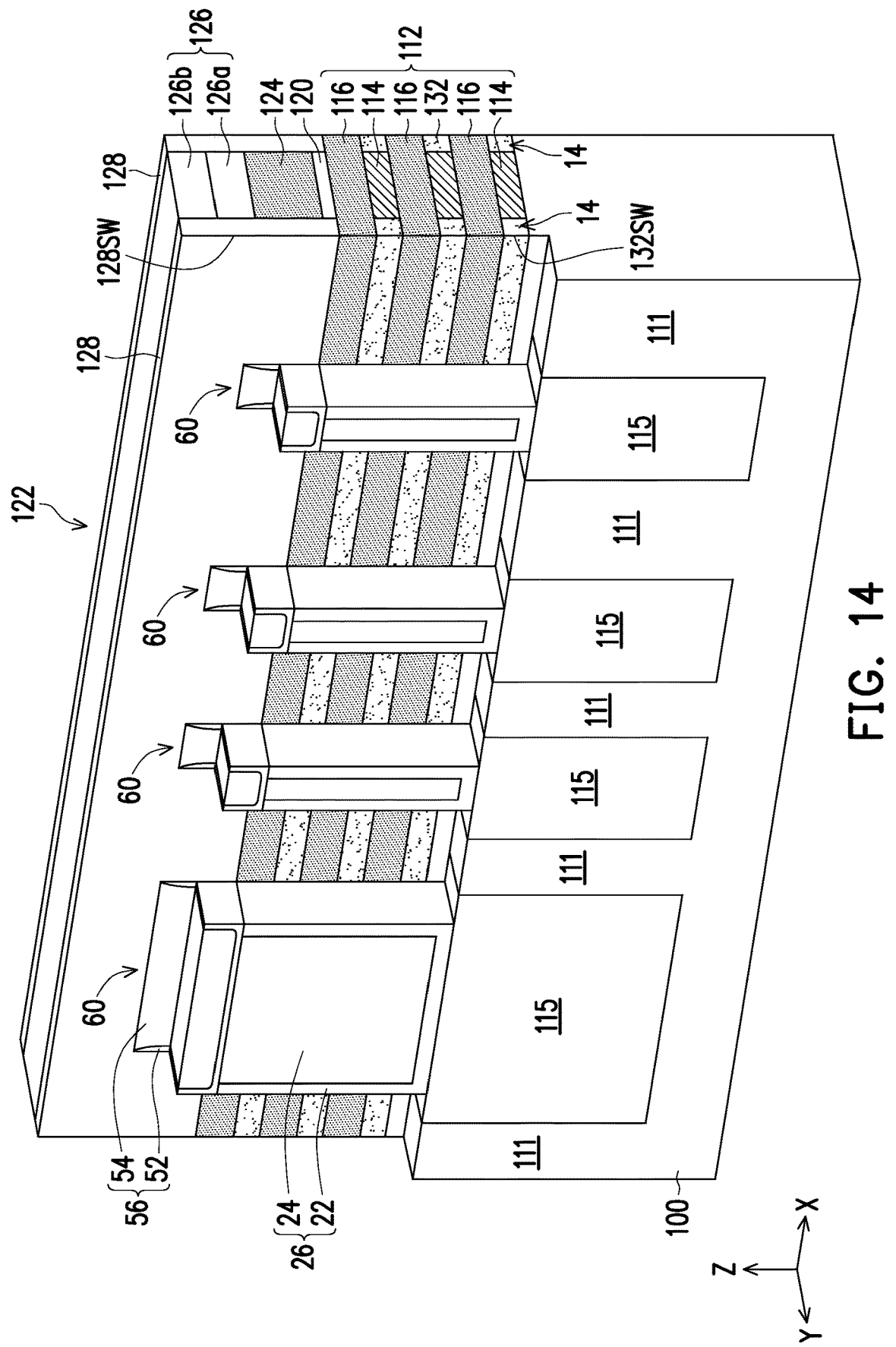

Referring to FIG. 14, portions of the first nanosheets 114 are laterally recessed. In some embodiments, the portions of the first nanosheets 114 exposed by the S/D recesses 12 are removed, and thus a plurality of cavities 14 are respectively formed between the second nanosheets 116. In some embodiments, the first nanosheets 114 are laterally recessed by a wet etching, a dry etching, or a combination thereof. For example, the first nanosheets 114 may be selectively etched by using a wet etchant such as, but not limited to, ammonium hydroxide (NH₄OH), tetramethylammonium hydroxide (TMAH), ethylenediamine pyrocatechol (EDP), or potassium hydroxide (KOH) solutions. Alternatively, before laterally recessing the portions of the first nanosheets 114, the end portions of the first nanosheets 114 exposed by the recesses 12 may be selectively oxidize, so as to increase the etching selectivity between the first and second nanosheets 114 and 116. In some alternative embodiments, the oxidation process may be performed by exposing to a wet oxidation process, a dry oxidation process, or a combination thereof. The chemical used in the oxidation process may include H₂SO₄ or the like.

An inner spacer material layer (not shown) is formed on the substrate 100. In some embodiments, the inner spacer material layer conformally covers the S/D recesses 12, the dummy gate stack 122, and the spacers 128, and further fills in the cavities 14 to reduce the size of the cavities 14 or completely fill in the cavities 14. In some embodiments, the inner spacer material layer includes silicon oxides, silicon nitrides, silicon carbides, silicon carbide nitride, silicon oxide carbide, silicon carbide oxynitride, and/or other suitable dielectric materials, and may be formed by ALD or any other suitable method. In some alternative embodiments, the inner spacer material layer includes a low-k dielectric material having a dielectric constant lower than 3.9.

A portion of the inner spacer material layer is removed to form a plurality of inner spacers 132 in the cavities 14. In some embodiments, the portion of the inner spacer material layer is removed by a plasma dry etching or any other suitable method. Generally, the plasma dry etching etches a layer in wide and flat areas faster than a layer in concave (e.g., holes, grooves and/or slits) portions. Thus, the inner spacer material layer may remain inside the cavities 14. The remained portions of the inner spacer material layer are referred to as the inner spacers 132.

In some embodiments, the outer sidewalls 132SW of the inner spacers 132 are aligned with the sidewalls 116*s* of the second nanosheets 116. That is, the inner spacer material on the sidewalls is etched and the inner spacer material filled in the cavities 14 are not etched during the said plasma dry etching. However, the embodiments of the present disclosure are not limited thereto, in some alternative embodiments, the outer sidewalls 132SW of the inner spacers 132 are dented or concave from the sidewalls 116*s* of the second nanosheets 116 (not shown).

Figure 15:
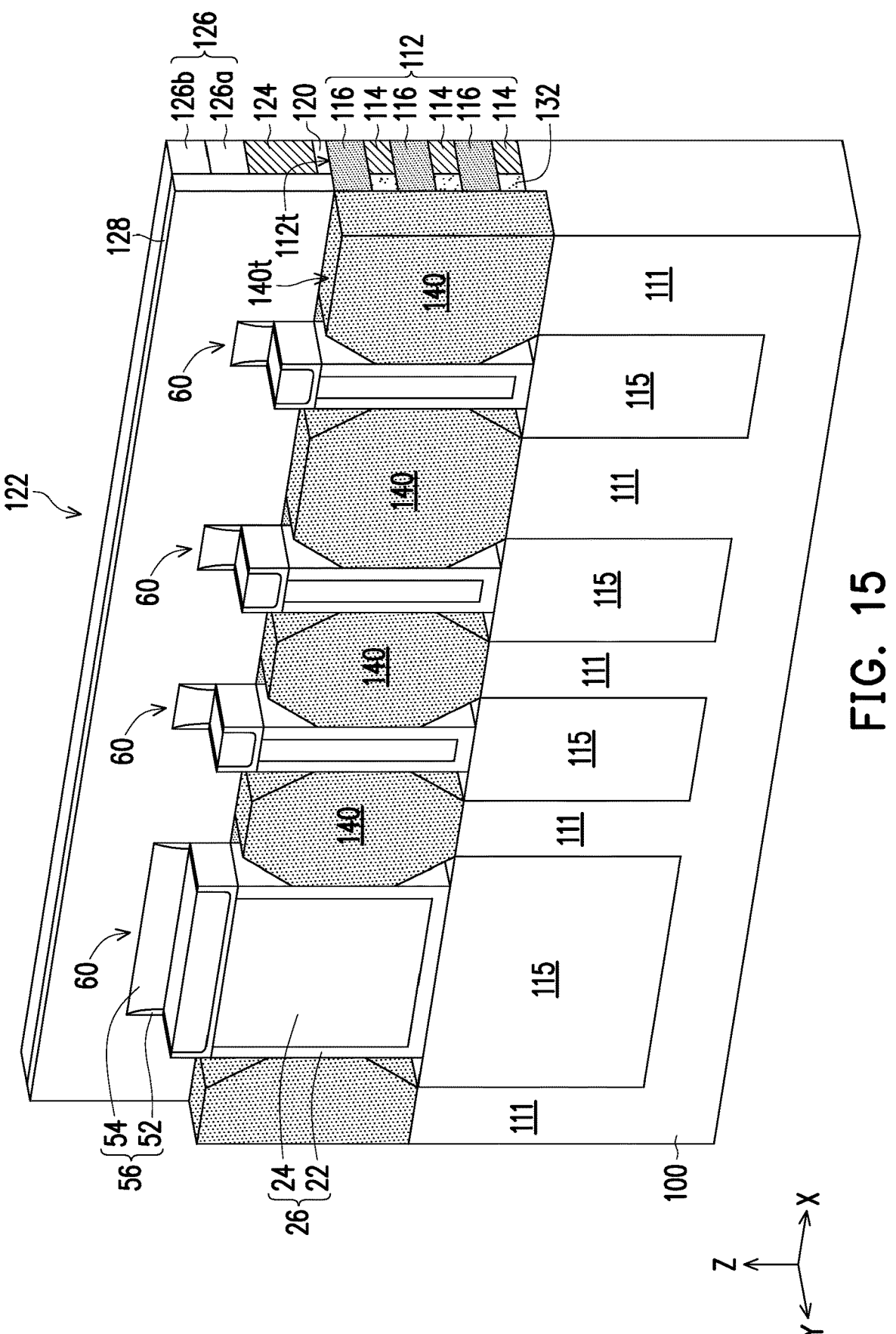

Referring to FIG. 15, strained materials 140 (or a highly doped low resistance material) are formed on the end of the fins 111. In some embodiments, the strained material 140 is used to strain or stress the second nanosheets (which may be referred to as channel members) 116 and the fins 111. Herein, the strained material 140 may be referred to as S/D features 140. In the case, the strained material 140 includes a source disposed at one side of the dummy gate stack 122 and a drain disposed at another side of the dummy gate stack 122. The source covers an end of the fins 111, and the drain covers another end of the fins 111. The S/D features 140 are abutted and electrically connected to the second nanosheets 116 by the liner layer 134, while the S/D features 140 are electrically isolated from the first nanosheets 114 by the inner spacers 232. In some embodiments, the S/D features 140 extends beyond the top surface 112*t* of the nanosheet stacks 112. However, the embodiments of the present disclosure are not limited thereto, in other embodiments, the top surface 140*t* of the S/D features 140 is substantially aligned with the top surface 112*t* of the nanosheet stacks 112.

In some other embodiments, the S/D features 140 include any acceptable material, such as appropriate for p-type FinFETs. For example, the S/D features 140 may include SiGe, SiGeB, Ge, GeSn, or the like. In some alternative embodiments, the S/D features 140 includes any acceptable material, such as appropriate for n-type FinFETs. For example, the S/D features 140 may include silicon, SiC, SiCP, SiP, or the like. In some embodiments, the S/D features 140 are formed by MOCVD, MBE, ALD, or the like.

In some embodiments, the S/D features 140 may be doped with a conductive dopant. For example, the S/D features 140, such as SiGe, may be epitaxial-grown with a p-type dopant for straining a p-type FinFET. That is, the S/D features 140 is doped with the p-type dopant to be the source and the drain of the p-type FinFET. The p-type dopant includes boron or BF₂, and the S/D features 140 may be epitaxial-grown by LPCVD process with in-situ doping. In some alternative embodiments, the S/D features 140, such as SiC, SiP, a combination of SiC/SiP, or SiCP is epitaxial-grown with an n-type dopant for straining an n-type FinFET. That is, the S/D features 140 is doped with the n-type dopant to be the source and the drain of the n-type FinFET. The n-type dopant includes arsenic and/or phosphorus, and the S/D features 140 may be epitaxial-grown by LPCVD process with in-situ doping.

As a result of the epitaxial-grown process used to form the S/D features 140, the cross section of the S/D features 140 may have a diamond or pentagonal shape as illustrated in FIG. 15. However, the embodiments of the present disclosure are not limited thereto. In other embodiments, the cross section of the S/D features 140 also have a hexagonal shape, a pillar shape, or a bar shape. In some embodiments, as shown in FIG. 15, adjacent S/D features 140 are separated from each other by the separator structures 60.

Figure 16:
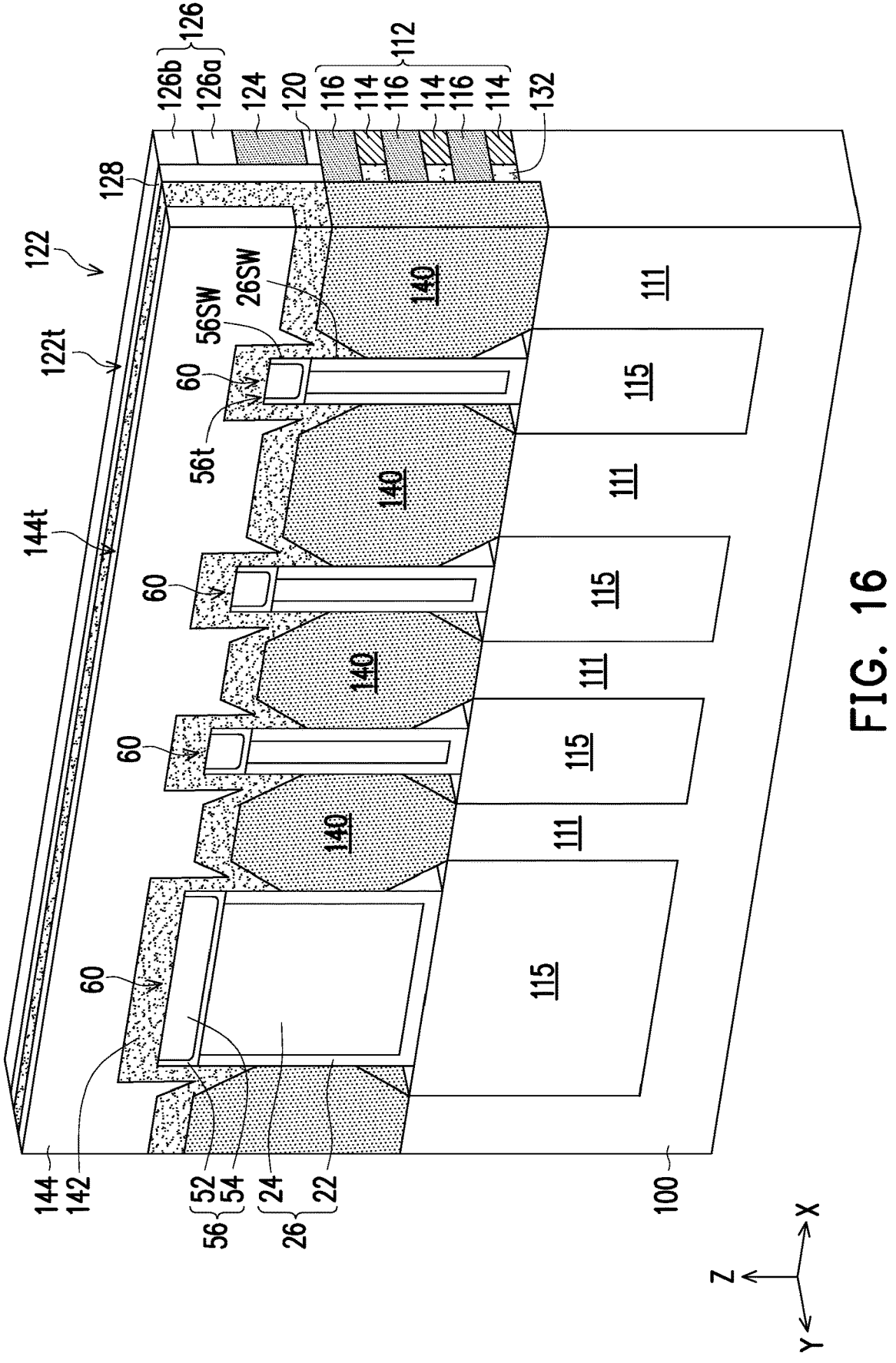

Referring to FIG. 16, a contact etch stop layer (CESL) 142 is formed over the S/D features 140, and then an interlayer dielectric (ILD) layer 144 is formed over the CESL 142. In some embodiments, the CESL 142 conformally covers the S/D features 140, the separator structures 60, and the sidewalls of the outer sidewall 128SW of the spacers 128. The outer sidewalls 56SW and the top surfaces 56t of the caps 56 and portions of the outer sidewalls 26SW of the bodies 26 are covered by the CESL 142. A portion of the CESL 142 is laterally sandwich between the separator structure 60 and the source/drain (S/D) features 140.

The CESL 142 may include silicon nitride, silicon oxynitride, silicon nitride with oxygen (O) or carbon (C) elements, and/or other materials; and may be formed by CVD, PVD (physical vapor deposition), ALD, or other suitable methods. In some embodiments, the ILD layer 144 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 144 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 144 include one or more dielectric materials and/or one or more dielectric layers. In some embodiments, the ILD layer 144 is formed to a suitable thickness by FCVD, CVD, HDPCVD, SACVD, spin-on, sputtering, or other suitable methods. For example, an interlayer dielectric material layer (not shown) is initially formed to cover the isolation structures 115, the dummy gate stack 122, and the spacers 128. Subsequently, a thickness of the interlayer dielectric material layer is reduced until the dummy gate stack 122 is exposed, so as to form the ILD layer 144. The process of reducing the thickness of the interlayer dielectric material layer may be achieved by a chemical mechanical polishing (CMP) process, an etching process, or other suitable processes. In the case, a top surface 144t of the ILD layer 144 may be coplanar with the top surface 122t of the dummy gate stack 122.

Figure 17:
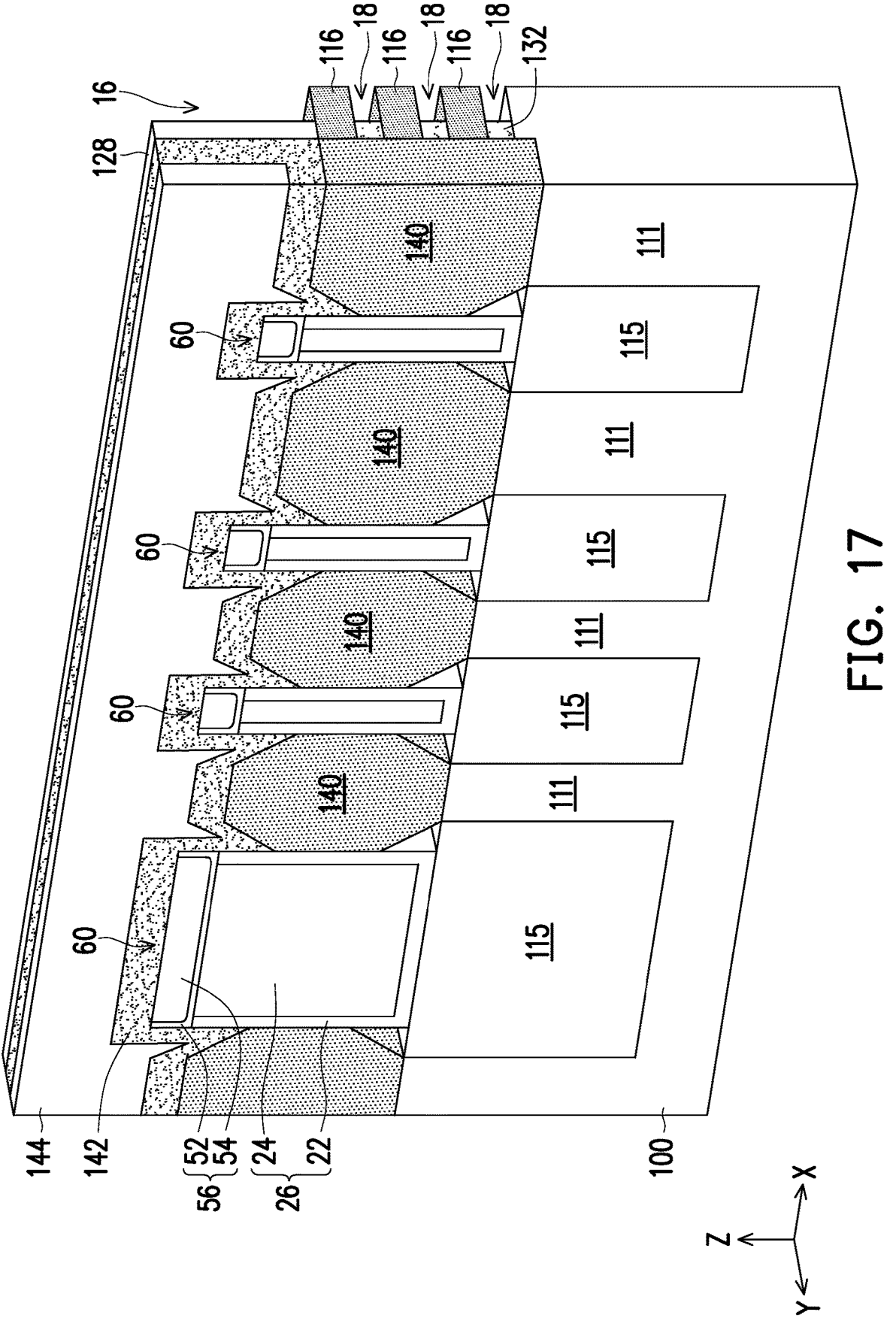

Referring to FIG. 17, the dummy gate stack 122 is removed to form a gate trench 16 (shown in FIG. 17). The ILD layer 144 and the CESL 142 may protect the S/D features 140 during removing the dummy gate stack 122. The dummy gate stack 122 may be removed by using plasma dry etching and/or wet etching. When the dummy gate electrode is polysilicon and the ILD layer 144 is silicon oxide, a wet etchant such as a TMAH solution may be used to selectively remove the dummy gate electrode. The dummy gate dielectric layer is thereafter removed by using another plasma dry etching and/or wet etching.

Referring to FIG. 17, an etching process is performed to remove the first nanosheets 114. In the case, the first nanosheets 114 may be completely removed to form a plurality of gaps 18 between the second nanosheets 116. Accordingly, the second nanosheets 116 are separated from each other by the gaps 18. In addition, the bottommost second nanosheet 116 may also be separated from the fin 111 by the gaps 18. As a result, the second nanosheets 116 are suspended. The opposite ends of the suspended second nanosheets 116 are connected to S/D features 140. Herein, the suspended second nanosheets 116 may be referred to as channel members 116. Herein the etching process may be referred to as nanosheet formation or releasing nanosheet process.

In the present embodiment, the second nanosheets 116 include silicon, and the first nanosheets 114 include silicon germanium. The first nanosheets 114 may be selectively removed by oxidizing the first nanosheets 114 using a suitable oxidizer, such as ozone. Thereafter, the oxidized first nanosheets 114 may be selectively removed from the gate trench 16. In some embodiments, the etching process includes a dry etching process to selectively remove the first nanosheets 114, for example, by applying an HCl gas at a temperature of about 20° C. to about 300° C., or applying a gas mixture of $CF_4$, $SF_6$, and $CHF_3$. Herein, as shown in FIG. 19, vertically stacked nanosheets 116 may be referred to as semiconductor nanosheet stacks or channel stack of the n-type and/or p-type semiconductor device, alternatively.

Figure 18:
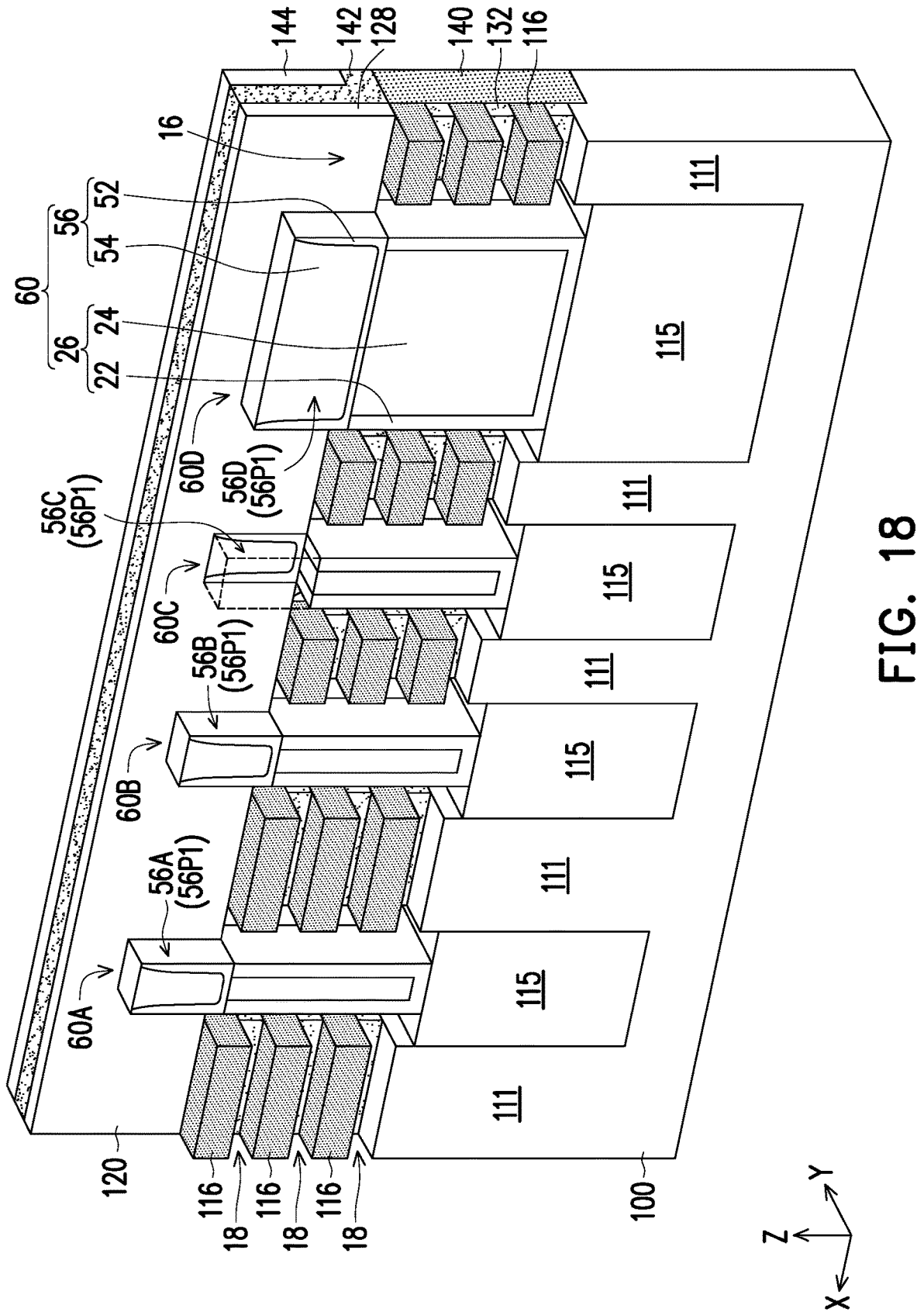

Referring to FIG. 18, the separator structures 60 may be patterned to remove some of the caps 56 using acceptable photolithography and etching techniques. In the case, the cap 56C of the separator structures 60C that is not exposed by the spacers 128 is removed, while the caps 56A, 56B and 56D of the separator structures 60A, 60B and 60D are left. That is, the separator structures 60A, 60B and 60D that is exposed by the spacers 128 are higher than the separator structures 60C Referring to FIG. 19, a gate dielectric layer 152 is formed in the gate trench 16 and the gaps 18. The gate dielectric layer 152 wrapping the second nanosheets 116 and the separator structures 60 (shown in FIG. 20). In addition, the gate dielectric layer 152 conformally covers the gate trench 16 to form a U-shape cross-section, as shown in FIG. 19. In some embodiments, the gate dielectric layer 152 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 152 includes an interfacial layer (not shown) formed between the channel members and the dielectric material. The gate dielectric layer 152 may be formed by CVD, ALD or any suitable method. In one embodiment, the gate dielectric layer 152 is formed by using a highly conformal deposition process, such as ALD in order to ensure the formation of a gate dielectric layer having a uniform thickness around each channel members. A thickness of the gate dielectric layer 152 is in a range from about 0.5 nm to about 3 nm in some embodiments.

Figure 19:
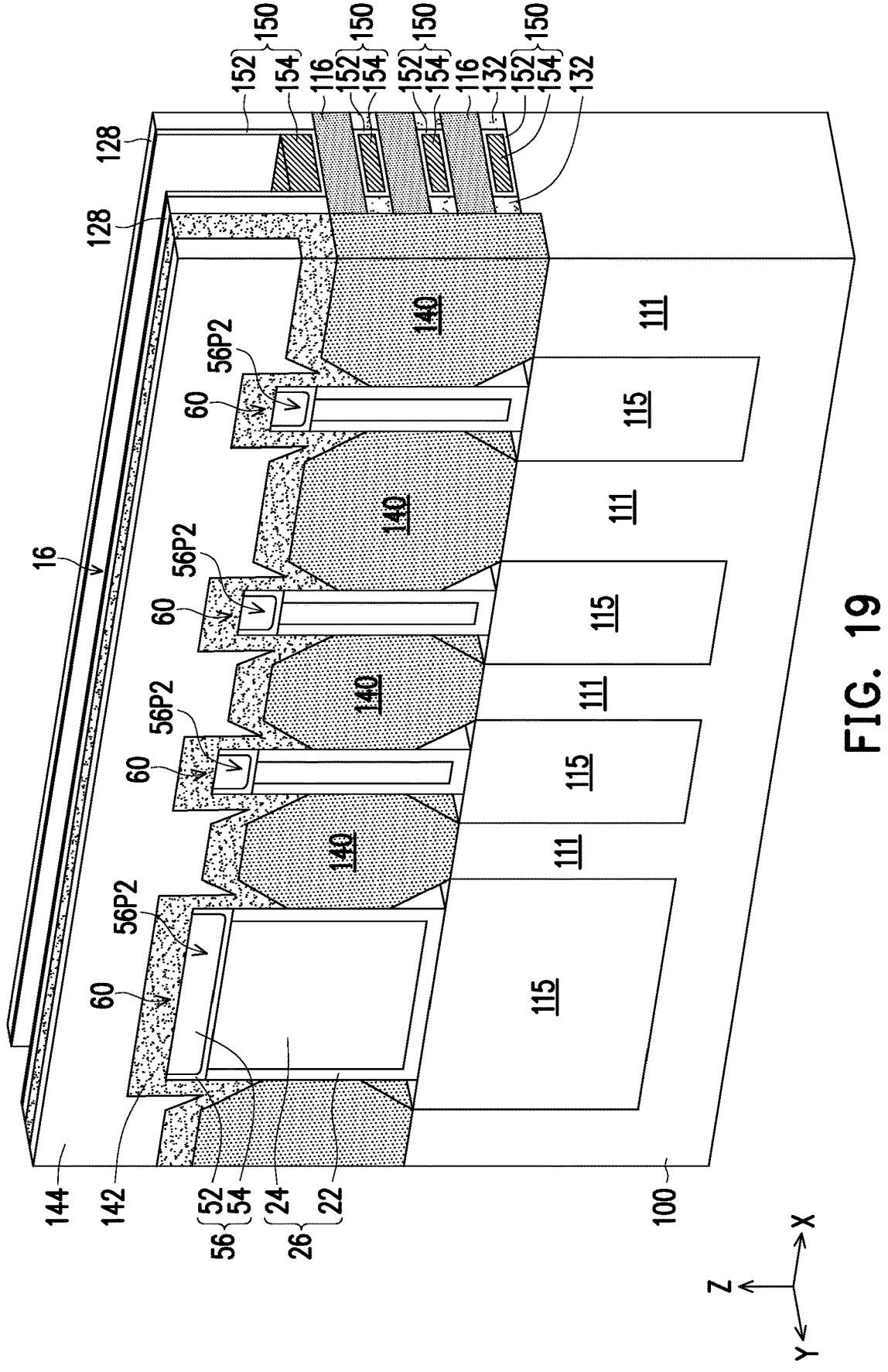

Referring to FIG. 19, gate electrodes 154 are formed on the gate dielectric layer 152 to surround each nanosheet or channel member 116. In the case, the gate electrodes 154 and the gate dielectric layer 152 constitute gate stacks 150. The gate electrodes 154 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 154 may be formed by CVD, ALD, electro-plating, or other suitable method. In some alternative embodiments, one or more work function adjustment layers (not shown) are interposed between the gate dielectric layer 152 and the gate electrode 154. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TiN, TiC, Co, TiAl, HfTi, TiSi and TaSi is used as the work function adjustment layer, and for the p-type device, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-type device and the p-type device which may use different metal layers.

The gate dielectric layer 152 and the gate electrodes 154 may also be deposited over the upper surfaces of the ILD layer 144 and the CESL 142. The gate dielectric layer 152 and the gate electrodes 154 formed over the ILD layer 144 and the CESL 142 are then planarized by using, for example, CMP, until the top surfaces of the ILD layer 144 and the CESL 142 are revealed. In the case, after the planarization operation, the gate electrodes 154 are recessed by an etch back process so that the gate dielectric layer 152 on the portions 56P1 of the caps 56A, 56B and 56D is exposed. In some other embodiments, the gate electrodes 154 are recessed so that the top surfaces 56t the portions 56P1 of the caps 56A, 56B and 56D of the separator structures 60A, 60B and 60D are exposed. That is, the top surfaces 56t of the caps 56A, 56B and 56D are substantially coplanar with or higher than top surfaces 154t of the gate electrodes 154.

The portions 56P1 of the caps 56A, 56B and 56D may be used to cut the gate electrode 154A, 154B, 154C and 154E of the gate stacks 150A, 150B, 150C and 150E. The portions 56P1 of the cap 56C (shown in FIG. 18) of the separator structure 60C that is exposed by the spacer is removed, so that the gate electrode 154C of the gate stacks 150C may be connected to the gate electrode 154D of the gate stacks 150D.

In detail, the gate stacks 150 includes gate stacks 150A, 150B, 150C, 150D, and 150E. A gate electrode 154A of the gate stacks 150A may be separated from a gate electrode 154B of the gate stacks 150B by the cap 56A of the separator structure 60A. The gate electrode 154B of the gate stacks 150B may be separated from a gate electrode 154C of the gate stacks 150C by the cap 56B of the separator structure 60B. The gate electrode 154C of the gate stacks 150C is connected to a gate electrode 154D of the gate stacks 150D. The gate electrode 154D of the gate stacks 150D is separated from a gate electrode 154E of the gate stacks 150E by the cap 56D of the separator structure 60D.

Since there is no void or seam in the cap 56, abnormal bridging between the gate electrodes 154 due to the conductive material of the gate electrode 154 filled in the void or seam may be prevented.

Figure 20:
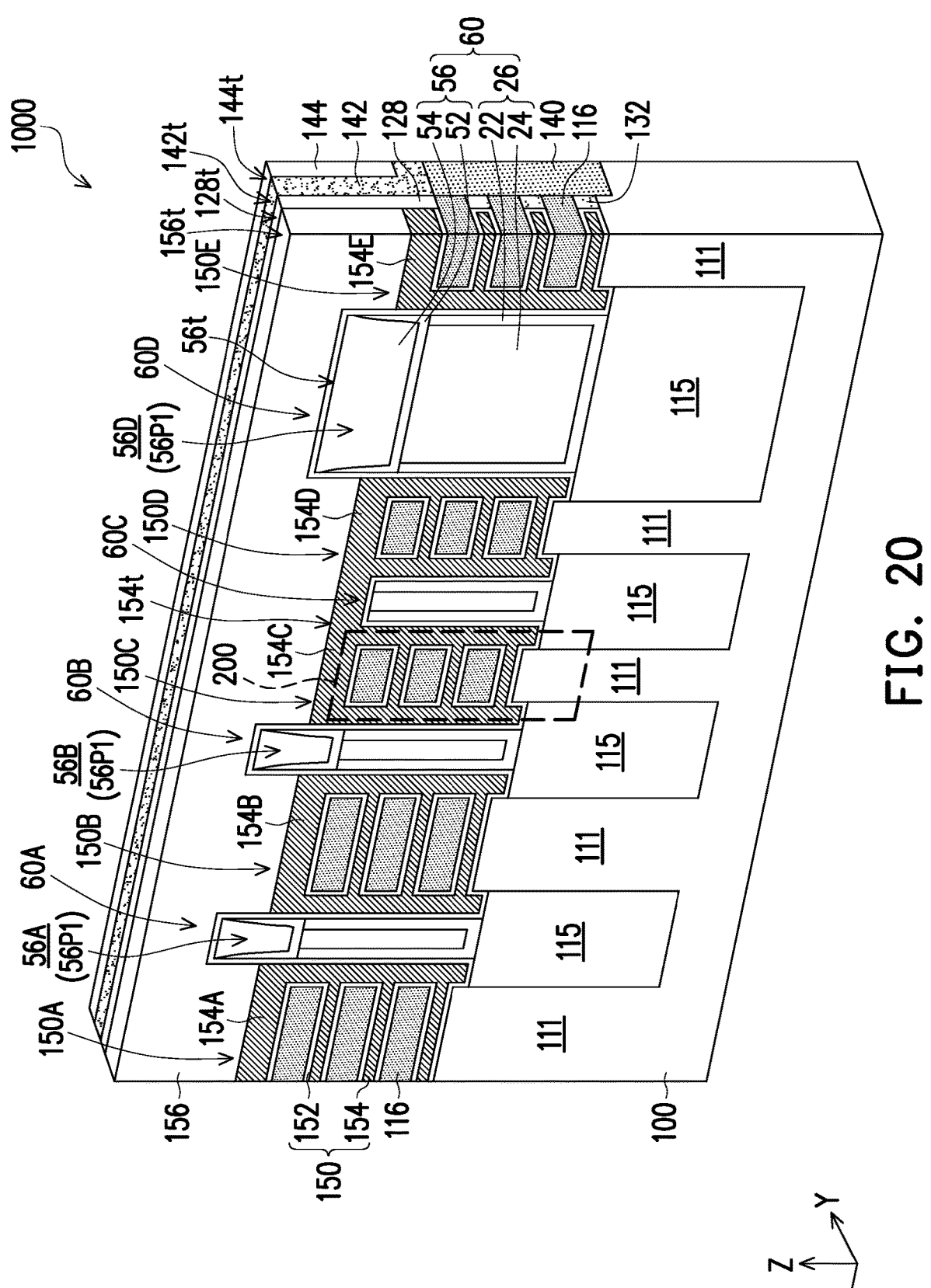

Referring to FIG. 20, an ILD 156 is formed over the gate electrodes 154, and the separator structures 60A, 60B, 60C and 60D in the trench 16. In some embodiments, the ILD 156 may include silicon nitride, silicon oxynitride, silicon nitride with oxygen (O) or carbon (C) elements, and/or other materials; and may be formed by CVD, PVD (physical vapor deposition), ALD, or other suitable methods. In some embodiments, the ILD layer 156 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 156 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 156 include one or more dielectric materials and/or one or more dielectric layers. In some embodiments, the ILD layer 156 is formed to a suitable thickness by FCVD, CVD, HDPCVD, SACVD, spin-on, sputtering, or other suitable methods. For example, an interlayer dielectric material layer (not shown) is initially formed to cover the gate electrodes 154, and the separator structures 60A, 60B, 60C and 60D in the trench 16, and to cover the ILD 144, the CESL 142, and the spacers 128. Subsequently, a thickness of the interlayer dielectric material layer is reduced until the ILD 144, the CESL 142, and the spacers 128 is exposed, so as to form the ILD layer 156. The process of reducing the thickness of the interlayer dielectric material layer may be achieved by a chemical mechanical polishing (CMP) process, an etching process, or other suitable processes. In the case, the top surface 156t of the ILD layer 156 may be coplanar with the top surfaces 128t of the spacers 128, the top surface 144t of the ILD 144, and a top surface 142t of the CESL 142.

In some embodiments, before the ILD 156 is formed, conductive features (not shown) may be formed on the gate stacks 150 to connect some of the gate electrodes 154. The conductive features may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The conductive features may be formed by CVD, ALD, electro-plating, or other suitable method. Thereafter, the conductive material may be patterned using acceptable photolithography and etching techniques so that the conductive features are formed.

Thereafter, contacts (not shown) such as gate contacts, control contacts, and epitaxial region contacts may then be formed through the ILD 156, the ILD 144 and the CESL 142, and thus a semiconductor device 1000 is formed in accordance with some embodiments. One of the contacts may include a liner (not shown) and a conductive material. The liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, the like, or a combination thereof. A planarization process, such as a CMP, may be performed to remove excess material from the top surface 156t of the ILD 156.

FIG. 21 to FIG. 24 are partial enlarged views of an enclosed region 200 of the semiconductor device 1000 of FIG. 20.

Figure 22:
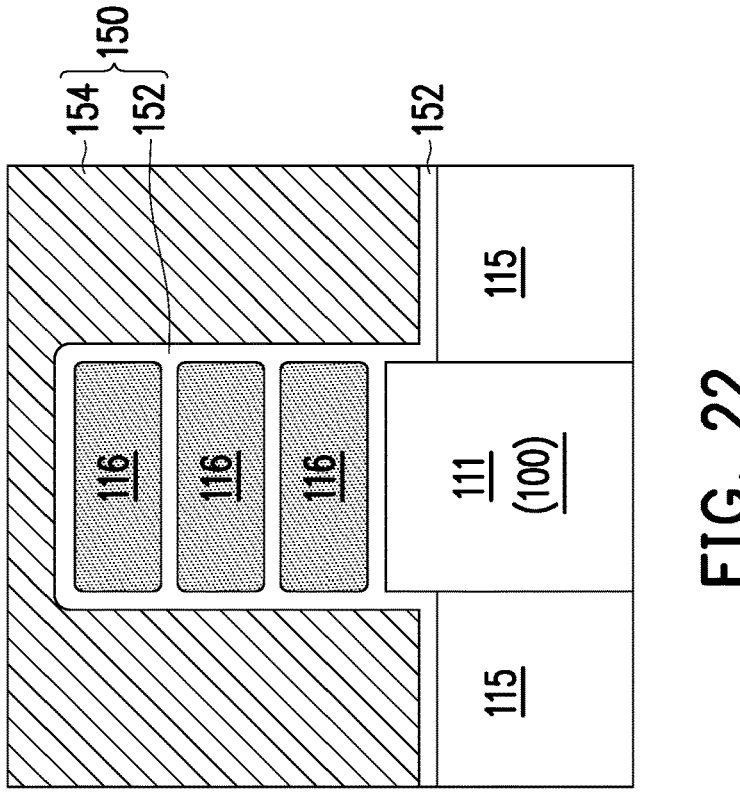
FIG. 21 to FIG. 24 are partial enlarged views of an enclosed region of the semiconductor device in FIG. 20.
Figure 21:
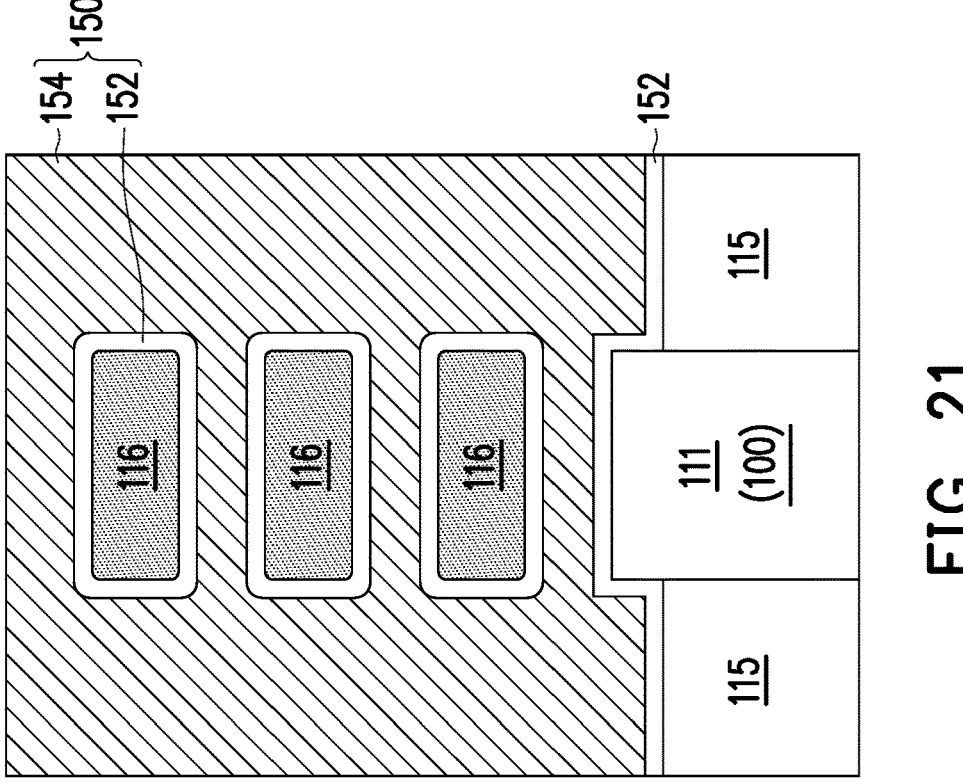
Figure 24:
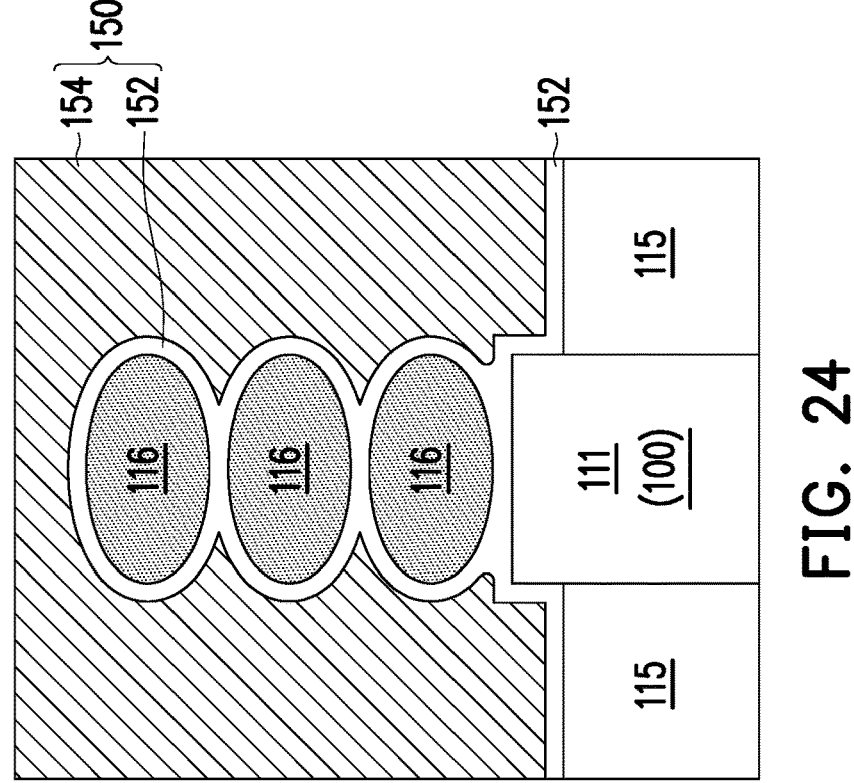
Figure 23:
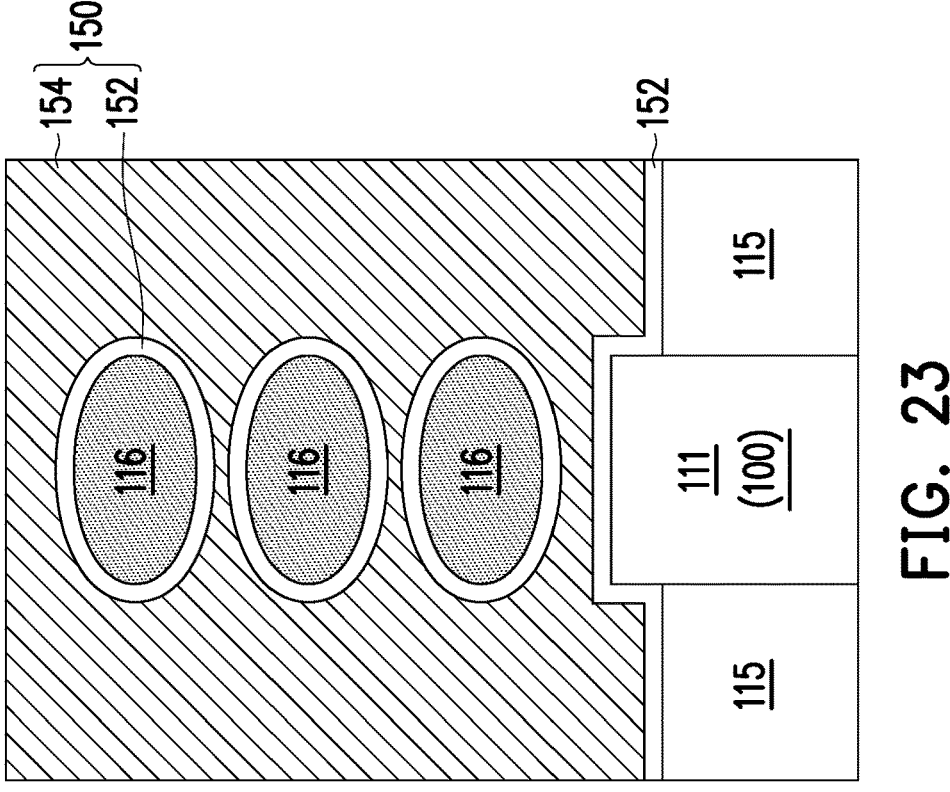

Referring to FIG. 21, in the embodiment, the gate dielectric layer 152 wraps the second nanosheets 116 (hereinafter referred to as channel members 116). In some embodiments, one of the channel members 116 has rounded corners, a flat top surface connecting two adjacent rounded corners, and a flat bottom surface connecting other adjacent rounded corners. The gate dielectric layer 152 wrapping the corresponding channel member 116 also has rounded corners, a flat top surface, and a flat bottom surface. The gate electrode 154 is sandwiched between adjacent channel members 116 to separate the gate dielectric layers 152 from each other, as shown in FIG. 21. However, the embodiment of the disclosure is not limited thereto, in other embodiments, portions of the gate dielectric layer 154 wrapping the channel members 116 are connected together to form a continuous region. In the case, as shown in FIG. 22, the gate electrode 154 will not be filled into the gaps between the channel members 116. Although the channel members 116 in cross-section illustrated in FIG. 21 and FIG. 22 are rectangle-like shape, the embodiment of the disclosure is not limited thereto. In some alternative embodiments, as shown in FIG. 23 and FIG. 24, the channel members 116 in cross-section may be circular shape, elliptical shape, or the like.

In accordance with some embodiments, the separator structure (or referred to as cut metal gate, CMG) structure is formed before forming the gate stacks. The separator structure is free of voids or seams therein which is benefit to avoid filling of conductive material therein, thereby preventing abnormal bridging between the gate electrodes form suffering yield issue.

According to some embodiments, a semiconductor device includes a substrate including a plurality of fins, a plurality of semiconductor nanosheets stacked on the plurality of fins, a plurality of gate stacks wrapping the plurality of semiconductor nanosheets, an isolation structure around the plurality of fins, and a separator structure on the isolation structure to separate the plurality of gate stacks from each other. The separator structure includes a body and a cap on the body. The cap includes a first portion and a second portion. Sidewalls and bottom of the second portion is wrapped by the first portion.

According to some embodiments, a semiconductor device includes a substrate includes a plurality of fins, an isolation structure around the plurality of fins, a plurality of source/drain (S/D) features on the plurality of fins, and a separator structure on the isolation structure to separate the plurality of source/drain (S/D) features from each other. The separator structure includes a body, and a cap on the body. The cap has a plurality of portions and a first interface between the plurality of portions.

According to some embodiments, a method of forming a semiconductor device includes the following steps. A substrate including a plurality of fins is provided. A plurality of semiconductor nanosheets are stacked on the plurality of fins. An isolation structure is formed around the plurality of fins. A separator structure is formed on the isolation structure. The separator structure includes a body and a cap on the body. The cap includes a first portion, and a second portion on the first portion. Sidewalls and bottom of the second portion is wrapped by the first portion. A plurality of gate stacks are formed to wrap the plurality of semiconductor nanosheets. The separator structure separates the plurality of gate stacks from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising fins;
   semiconductor nanosheets stacked on the fins;
   an isolation structure around the fins;
   a separator structure on the isolation structure, wherein the separator structure comprises:
   a body; and a cap disposed on the body, wherein the cap comprises a first cap portion and a second cap portion connected to the first cap portion, the second cap portion extends laterally from the first cap portion in a direction different from a stacking direction of the semiconductor nanosheets, and the first cap portion is thicker than the second cap portion along the stacking direction of the semiconductor nanosheets, and a first top surface of the first cap portion is higher than a second top surface of the second cap portion along the stacking direction of the semiconductor nanosheets.

2. The semiconductor device of claim 1, wherein a top surface of the body is covered by the second cap portion.

3. The semiconductor device of claim 1, wherein the cap comprises:
   a first dielectric portion; and
   a second dielectric portion, wherein sidewalls and bottom of the second dielectric portion is wrapped by the first dielectric portion, an interface is between the first dielectric portion and the second dielectric portion, and the interface comprises a first segment; a second segment; and a third segment, wherein the first segment and the third segment extend longitudinally, and the second segment extends laterally and is connected to bottom ends of the first segment and the third segment.

4. The semiconductor device of claim 3, wherein a minimum horizontal distance between the first segment and an outer sidewall of the cap decreases from bottom to top.

5. The semiconductor device of claim 3, wherein a minimum horizontal distance between the third segment and an outer sidewall of the cap decreases from bottom to top.

6. The semiconductor device of claim 3, wherein a top width of the second dielectric portion of the cap is greater than a bottom width of the second dielectric portion of the cap.

7. The semiconductor device of claim 1, wherein outer sidewalls of the cap substantially align with outer sidewalls of the body.

8. The semiconductor device of claim 3, wherein the first segment and the third segment are arcs or inclined lines.

9. The semiconductor device of claim 3, wherein the second dielectric portion of the cap is free of voids or seams.

10. A semiconductor device, comprising:
   a substrate comprising fins;
   semiconductor nanosheets stacked on the fins;
   an isolation structure around the fins;
   source/drain (S/D) features on the fins;
   a separator structure on the isolation structure to separate the source/drain (S/D) features from each other, wherein the separator structure comprises:
   a body in contact with the isolation structure; and
   a cap disposed on the body, wherein the cap comprises a first cap portion and a second cap portion connected to the first cap portion, the second cap portion extends laterally from the first cap portion in a direction orthogonal to a stacking direction of the semiconductor nanosheets, and a first top surface of the first cap portion is higher than a second top surface of the second cap portion along the stacking direction of the semiconductor nanosheets.

11. The semiconductor device of claim 10, wherein the cap comprises a first dielectric portion and a second dielectric portion, an interface is between the first dielectric portion and the second dielectric portion, and the interface comprises:
   a first segment;
   a second segment; and a third segment, wherein the first segment and the third segment extend longitudinally, and the second segment extends laterally and is connected to bottom ends of the first segment and the third segment.

12. The semiconductor device of claim 10, wherein the second top surface of the second cap portion is located at a height level between the first top surface of the first cap portion and a top surface of the body.

13. The semiconductor device of claim 10, wherein the cap comprises a bottom portion disposed on the body and a top portion disposed on the bottom portion, and the top portion of the cap is narrower than the bottom portion of the cap.

14. The semiconductor device of claim 10, further comprising an etch stop layer on the source/drain (S/D) features and the separator structure, and sidewalls and a top surface of the cap are covered by the etch stop layer.

15. The semiconductor device of claim 14, wherein a portion of the etch stop layer is laterally sandwich between the separator structure and the source/drain (S/D) features.

16. A method of forming a semiconductor device, comprising:

providing a substrate comprising a plurality of fins;

forming a plurality of semiconductor nanosheets stacked on the plurality of fins;

forming an isolation structure around the plurality of fins; and forming a separator structure on the isolation structure, wherein the forming the separator structure comprises:

forming a body; and forming a cap on the body, wherein the cap comprises a first cap portion and a second cap portion connected to the first cap portion, the second cap portion extend laterally from the first cap portion in a direction orthogonal to a stacking direction of the semiconductor nanosheets, and a first top surface of the first cap portion is higher than a second top surface of the second cap portion along the stacking direction of the semiconductor nanosheets.

17. The method of claim 16, further comprising forming a gate stack over a portion of the semiconductor nanosheets and a portion of the separator structure.

18. The method of claim 17, further comprising performing a removal process to remove end portions of the semiconductor nanosheets, and a portion of the cap not covered by the gate stack, thereby forming a first cap portion covered by the gate stack and the second cap portion uncovered by the gate stack.

19. The method of claim 16, further comprising forming a first dielectric material on the body, and a second dielectric material over the first dielectric material to form the cap.

20. The method of claim 19, wherein sidewalls and bottom of the second dielectric material is wrapped by the first dielectric material and a width of the first dielectric material contacting sidewalls of the second dielectric material continuously decreases from a top surface of the body in a direction towards a top end of the cap.

* * * * *